United States Patent
Kim et al.

(10) Patent No.: US 10,784,376 B2
(45) Date of Patent: *Sep. 22, 2020

(54) SEMICONDUCTOR DEVICE AND METHOD OF FABRICATING THE SAME

(71) Applicant: Samsung Electronics Co., Ltd., Suwon-si, Gyeonggi-do (KR)

(72) Inventors: Ki Hwan Kim, Seoul (KR); Gigwan Park, Suwon-si (KR); Junggun You, Ansan-si (KR); DongSuk Shin, Yongin-si (KR); Jin-Wook Kim, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/450,193

(22) Filed: Jun. 24, 2019

(65) Prior Publication Data

US 2019/0319127 A1    Oct. 17, 2019

Related U.S. Application Data

(63) Continuation of application No. 16/111,854, filed on Aug. 24, 2018, now Pat. No. 10,411,131, which is a (Continued)

(30) Foreign Application Priority Data

Oct. 26, 2015 (KR) .......................... 10-2015-0148961

(51) Int. Cl.
*H01L 29/78* (2006.01)
*H01L 21/8238* (2006.01)
(Continued)

(52) U.S. Cl.
CPC .. *H01L 29/7848* (2013.01); *H01L 21/823814* (2013.01); *H01L 21/823821* (2013.01);
(Continued)

(58) Field of Classification Search
CPC ............. H01L 29/7848; H01L 29/0847; H01L 29/161; H01L 29/165; H01L 29/1608;
(Continued)

(56) References Cited

U.S. PATENT DOCUMENTS 8,679,925 B2    3/2014   Wang
8,936,986 B2    1/2015   Wei et al.
(Continued)

FOREIGN PATENT DOCUMENTS

KR    10-1153158 B1    7/2012

*Primary Examiner* — Dao H Nguyen
(74) *Attorney, Agent, or Firm* — Harness, Dickey & Pierce, P.L.C.

(57) ABSTRACT

A semiconductor device includes first and second active patterns protruding upward from a substrate, a gate electrode crossing the first and second active patterns and extending in a first direction, a first source/drain region on the first active pattern and on at least one side of the gate electrode, and a second source/drain region on the second active pattern and on at least one side of the gate electrode. The first and second source/drain regions have a conductivity type different from each other, and the second source/drain region has a bottom surface in contact with a top surface of the second active pattern and at a lower level than that of a bottom surface of the first source/drain region in contact with a top surface of the first active pattern. The first active pattern has a first width smaller than a second width of the second active pattern.

18 Claims, 22 Drawing Sheets

Related U.S. Application Data continuation of application No. 15/288,080, filed on Oct. 7, 2016, now Pat. No. 10,090,413.

(51) Int. Cl.
| | | |
|---|---|---|
| *H01L 23/535* | (2006.01) | |
| *H01L 27/092* | (2006.01) | |
| *H01L 27/11* | (2006.01) | |
| *H01L 29/06* | (2006.01) | |
| *H01L 29/08* | (2006.01) | |
| *H01L 29/16* | (2006.01) | |
| *H01L 29/161* | (2006.01) | |
| *H01L 29/66* | (2006.01) | |
| *H01L 27/12* | (2006.01) | |
| *H01L 21/84* | (2006.01) | |
| *H01L 29/165* | (2006.01) | |

(52) U.S. Cl.
CPC .......... *H01L 21/823871* (2013.01); *H01L 21/823878* (2013.01); *H01L 23/535* (2013.01); *H01L 27/0924* (2013.01); *H01L 27/1104* (2013.01); *H01L 27/1116* (2013.01); *H01L 29/0653* (2013.01); *H01L 29/0847* (2013.01); *H01L 29/161* (2013.01); *H01L 29/1608* (2013.01); *H01L 29/66545* (2013.01); *H01L 29/66636* (2013.01); *H01L 21/845* (2013.01); *H01L 27/1211* (2013.01); *H01L 29/165* (2013.01)

(58) Field of Classification Search
CPC .......... H01L 29/0653; H01L 29/66545; H01L 29/66636; H01L 21/823821; H01L 21/823814; H01L 21/823871; H01L 21/823878; H01L 27/1116; H01L 27/1104; H01L 27/0924; H01L 23/535
USPC .............. 257/190, 192, 288, 368, 369, 401; 438/275, 283, 285
See application file for complete search history.

(56) References Cited

U.S. PATENT DOCUMENTS

| | | | |
|---|---|---|---|
| 8,937,353 | B2 | 1/2015 | Chen et al. |
| 9,053,944 | B2 | 6/2015 | Hong |
| 9,064,699 | B2 | 6/2015 | Wang et al. |
| 9,105,664 | B2 | 8/2015 | Cheng et al. |
| 9,112,015 | B2 | 8/2015 | Park et al. |
| 9,142,633 | B2 | 9/2015 | Besser et al. |
| 9,166,024 | B2 | 10/2015 | Hung et al. |
| 9,312,180 | B2* | 4/2016 | Chien ............. H01L 21/823431 |
| 9,385,191 | B2* | 7/2016 | Wu ...................... H01L 29/0649 |
| 10,090,413 | B2* | 10/2018 | Kim ..................... H01L 23/535 |
| 10,411,131 | B2* | 9/2019 | Kim ..................... H01L 29/0653 |
| 2011/0227162 | A1 | 9/2011 | Lin et al. |
| 2013/0244388 | A1 | 9/2013 | Scheiper et al. |
| 2013/0270652 | A1 | 10/2013 | Liaw |
| 2014/0167110 | A1 | 6/2014 | Javorka et al. |
| 2014/0312427 | A1 | 10/2014 | Maeda et al. |
| 2015/0091059 | A1* | 4/2015 | Hung ................ H01L 29/66795 257/192 |
| 2015/0140756 | A1 | 5/2015 | Yu et al. |
| 2015/0171085 | A1* | 6/2015 | Fumitake ............ H01L 27/0924 257/369 |
| 2015/0214345 | A1 | 7/2015 | Wan et al. |
| 2015/0221654 | A1 | 8/2015 | Kim et al. |
| 2015/0228502 | A1 | 8/2015 | Milenin et al. |
| 2016/0315081 | A1 | 10/2016 | Park et al. |

* cited by examiner

_US 10,784,376 B2_

SEMICONDUCTOR DEVICE AND METHOD OF FABRICATING THE SAME

CROSS-REFERENCE TO RELATED APPLICATION

This U.S. non-provisional patent application is a continuation of U.S. patent application Ser. No. 16/111,854, filed Aug. 24, 2018, which is a continuation of U.S. patent application Ser. No. 15/288,080, filed on Oct. 7, 2016, now U.S. Pat. No. 10,090,413, issued on Oct. 2, 2018, which claims the benefit of Korean Patent Application No. 10-2015-0148961, filed on Oct. 26, 2015, in the Korean Intellectual Property Office, the entire contents of each of the above-referenced applications are hereby incorporated by reference.

BACKGROUND

1. Field

Example embodiments of the present disclosure relate to a semiconductor device with a field effect transistor and a method of fabricating the same.

2. Description of the Related Art

Due to their relatively small-size, multi-functionality, and/or relatively low-cost characteristics, semiconductor devices are considered important elements in the electronic industry. The semiconductor devices may be classified into a memory device for storing data, a logic device for processing data, and a hybrid device including both memory and logic elements. To meet the increased demand for electronic devices with relatively fast speed and/or relatively low power consumption, semiconductor devices with relatively high reliability, relatively high performance, and/or multiple functions are needed. To satisfy these technical requirements, semiconductor devices require increased complexity and/or integration density.

SUMMARY

Some example embodiments of the inventive concepts provide a semiconductor device, in which a field effect transistor with improved electric characteristics is provided.

Some example embodiments of the inventive concepts provide a method of fabricating a semiconductor device, in which a field effect transistor with improved electric characteristics is provided.

According to some example embodiments of the inventive concepts, a semiconductor device includes first and second active patterns protruding upward from a substrate, a gate electrode crossing the first and second active patterns and extending in a first direction, a first source/drain region on the first active pattern and on at least one side of the gate electrode, and a second source/drain region on the second active pattern and on at least one side of the gate electrode. The second source/drain region may have a conductivity type different from that of the first source/drain region, and the second source/drain region may have a second bottom surface in contact with a second top surface of the second active pattern and at a lower level than a first bottom surface of the first source/drain region in contact with a first top surface of the first active pattern. The first top surface of the first active pattern may have a first width, and the second top surface of the second active pattern may have a second width greater than the first width.

In some example embodiments, the first active pattern and the first source/drain region may constitute an NMOSFET, and the second active pattern and the second source/drain region may constitute a PMOSFET.

In some example embodiments, the first and second active patterns may include first and second channel regions, respectively, when viewed in a plan view. The gate electrode may overlap the first and second channel regions. A surface area directly contacting the second channel region and the second source/drain region may be greater than a surface area directly contacting the first channel region and the first source/drain region.

In some example embodiments, the first and second channel regions may have top surfaces at a same level.

In some example embodiments, the first source/drain region may include a material having a first lattice constant equal to or smaller than that of the substrate, and the second source/drain region may include a material having a second lattice constant greater than that of the substrate.

In some example embodiments, a maximum width of the first source/drain region in the first direction may be a third width, and a maximum width of the second source/drain region in the first direction may be a fourth width different from the third width.

In some example embodiments, the device may further include a device isolation pattern on the substrate filling a gap region between the first and second active patterns. The device isolation pattern may include a first portion having a top surface, the gate electrode may overlap the first portion in a plan view, and a second portion on at least one side of the gate electrode, and the second portion may define a recess region having a bottom surface lower than the top surface of the first portion.

In some example embodiments, the bottom surface of the recess region may be lower than the first and second bottom surfaces of the first and second source/drain regions.

In some example embodiments, the device may further include an etch stop layer covering the first and second source/drain regions and the device isolation pattern. The etch stop layer may directly cover an inner surface of the recess region.

In some example embodiments, the device may further include gate spacers on opposite sides of the gate electrode and a gate insulating pattern between the gate electrode and the first and second active patterns, and between the gate electrode and the gate spacers.

According to some example embodiments of the inventive concepts, a semiconductor device includes a pair of first active patterns and a pair of second active patterns protruding upward from a substrate, device isolation patterns filling trenches between the first and second active patterns, a gate electrode crossing the first and second active patterns and extending in a first direction, a pair of first source/drain regions on respective ones of the first active patterns and on at least one side of the gate electrode, and a pair of second source/drain regions on respective ones of the second active patterns and on at least one side of the gate electrode. Each of the first source/drain regions has a first bottom surface in contact with respective first top surfaces of the first active patterns. Each of the second source/drain regions having a second bottom surface in contact with respective second top surfaces of the second active patterns. Each of the first top surfaces of the first active patterns has a first width in the first direction and each of the second top surfaces of the second active patterns has a second width greater than the first width in the first direction.

In some example embodiments, the first active patterns may include upper portions configured to serve as channel regions of an NMOSFET, and the second active patterns may include upper portions configured to serve as channel regions of a PMOSFET.

In some example embodiments, a distance between the pair of first active patterns in the first direction may be a first length, a distance between the pair of second active patterns in the first direction may be a second length longer than the first length, and a distance between an adjacent pair of the first and second active patterns may be a third length longer than the second length.

In some example embodiments, a surface area directly contacting a corresponding pair of the second source/drain regions and the second active patterns may be greater than a surface area directly contacting a corresponding pair of the first source/drain regions and the first active patterns.

In some example embodiments, each of the device isolation patterns may include first portions overlapped by the gate electrode in a plan view and a second portion on at least one side of the gate electrode. A first of the second portions of the device isolation patterns may include a first recess region between the pair of first active patterns, and a second of the second portions of the device isolation patterns may include a second recess region between the pair of second active patterns. A bottom surface of the first recess region may be higher than a bottom surface of the second recess region.

In some example embodiments, a third of the second portions may include a third recess region between an adjacent pair of the first active pattern and the second active pattern, and the bottom surface of the second recess region may be higher than a bottom surface of the third recess region.

In some example embodiments, the first source/drain regions may be connected to form an integral structure defining at least one first air gap, and the first air gap may be directly enclosed by the first source/drain regions and the device isolation patterns.

In some example embodiments, the device may further include an etch stop layer covering the first and second source/drain regions and the device isolation patterns. The etch stop layer may seal a gap region between the pair of second source/drain regions to define at least one second air gap below the second source/drain regions. The second air gap may be enclosed by the etch stop layer.

In some example embodiments, a volume of the second air gap may be larger than a volume of the first air gap.

In some example embodiments, the device may further include first residue patterns adjacent to interfaces between the second active patterns and the second source/drain regions. The first residue patterns may be between the pair of second active patterns.

In some example embodiments, at least one of the second source/drain regions may bend toward an adjacent one of the first source/drain regions.

In some example embodiments, the device may further include second residue patterns adjacent to interfaces between the first active patterns and the first source/drain regions. The second residue patterns may be on opposite sides of a lower portion of at least one of the first source/drain regions.

According to some example embodiments of the inventive concepts, a semiconductor device includes a substrate including a first region and a second region spaced apart from each other, a plurality of fin-shaped first active patterns on the first region of the substrate and spaced apart from each other by a first distance, a plurality of fin-shaped second active patterns on the second region of the substrate and spaced apart from each other by a second distance smaller than the first distance, a first gate electrode crossing the first active patterns and extending in a first direction, a second gate electrode crossing the second active patterns and extending in the first direction, first source/drain regions on respective ones of the first active patterns and on at least one side of the first gate electrode, and second source/drain regions on respective ones of the second active patterns and on at least one side of the second gate electrode. The first and second active patterns may have the same conductivity type, the first source/drain regions may be spaced apart from each other in the first direction, and the second source/drain regions may be connected to each other to form an integral structure arranged in the first direction.

In some example embodiments, the first and second active patterns may include upper portions configured to serve as channel regions of a PMOSFET.

In some example embodiments, the first region may be an SRAM region on which memory cells are provided, and the second region may be a logic region on which a logic circuit are provided.

In some example embodiments, the device may further include device isolation patterns filling trenches between the first active patterns and between the second active patterns, and at least one air gap enclosed by the device isolation patterns and the second source/drain regions forming the integral structure.

In some example embodiments, each of the device isolation patterns may include a first portion overlapped by one of the first and second gate electrodes, and a second portion on at least one side of the one of the first and second gate electrodes. A first of the second portions of the device isolation patterns may include a first recess region between an adjacent pair of the first active patterns, a second of the second portions of the device isolation patterns may include a second recess region between an adjacent pair of the second active patterns, and a bottom surface of the first recess region may be higher than a bottom surface of the second recess region.

In some example embodiments, the device may further include an etch stop layer on the first and second regions to cover the first and second source/drain regions and the device isolation patterns. The air gap may be separated from the etch stop layer.

According to some example embodiments of the inventive concepts, a method of fabricating a semiconductor device includes patterning an upper portion of a substrate to form first and second active patterns protruding upward from the substrate, forming a sacrificial gate pattern to cross the first and second active patterns and extend in a first direction, recessing upper portions of the first and second active patterns on at least one side of the sacrificial gate pattern such that the second active pattern has a top surface lower than a top surface of the first active pattern, forming first and second source/drain regions on the recessed upper portions of the first and second active patterns, respectively, the first and second source/drain regions being doped to have conductivity types different from each other, and replacing the sacrificial gate pattern with a gate electrode.

In some example embodiments, the patterning of the upper portion of the substrate may include patterning an NMOSFET region of the substrate to form the first active pattern and patterning a PMOSFET region of the substrate to form the second active pattern.

In some example embodiments, the method may further include forming a device isolation pattern on the substrate to fill a gap region between the first and second active patterns and recessing an upper portion of the device isolation pattern on a side of the sacrificial gate pattern to form a recess region.

In some example embodiments, the method may further include forming an etch stop layer on the substrate to cover the first and second source/drain regions and the device isolation pattern. The etch stop layer may directly cover an inner surface of the recess region.

In some example embodiments, the method may further include forming a gate spacer layer on the substrate and anisotropically etching the gate spacer layer to form gate spacers on opposite side surfaces of the sacrificial gate pattern.

In some example embodiments, recessing the upper portions of the first and second active patterns may allow a portion of the gate spacer layer configured to serve as a residue pattern to remain on at least one of the recessed upper portions of the first and second active patterns.

In some example embodiments, the method may further include forming an interlayered insulating layer on the substrate, forming contact holes to penetrate the interlayered insulating layer and expose the first and second source/drain regions, respectively, and forming source/drain contacts to fill the contact holes. Upper portions of the first and second source/drain regions may be etched when the contact holes are formed.

According to some example embodiments of the inventive concepts, a semiconductor device includes a first MOSFET structure including at least one first active pattern protruding upward from a substrate and at least one first source/drain region having a first bottom surface contacting a first top surface of the first active pattern, and a second MOSFET structure including at least one second active pattern protruding upward from a substrate and at least one second source/drain region having a second bottom surface contacting a second top surface of the second active pattern and at a lower level than the first bottom surface, the second source/drain region having a different shape than the first source/drain region. The first top surface of the first active pattern has a first width, and the second top surface of the second active pattern has a second width greater than the first width.

The first source/drain region may include a material having a first lattice constant equal to or smaller than that of the substrate, and the second source/drain region may include a material having a second lattice constant greater than that of the substrate.

A maximum width of the first source/drain region may be a third width and a maximum width of the second source/drain region may be a fourth width different from the third width.

The at least one first active pattern may be a pair of first active patterns and a distance between the pair of first active patterns is a first length, the at least one second active pattern is a pair of second active patterns and a distance between the pair of second active patterns is a second length longer than the first length, and a distance between the pair of first active patterns and the pair of second active patterns is a third length longer than the second length.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

Figure 1:
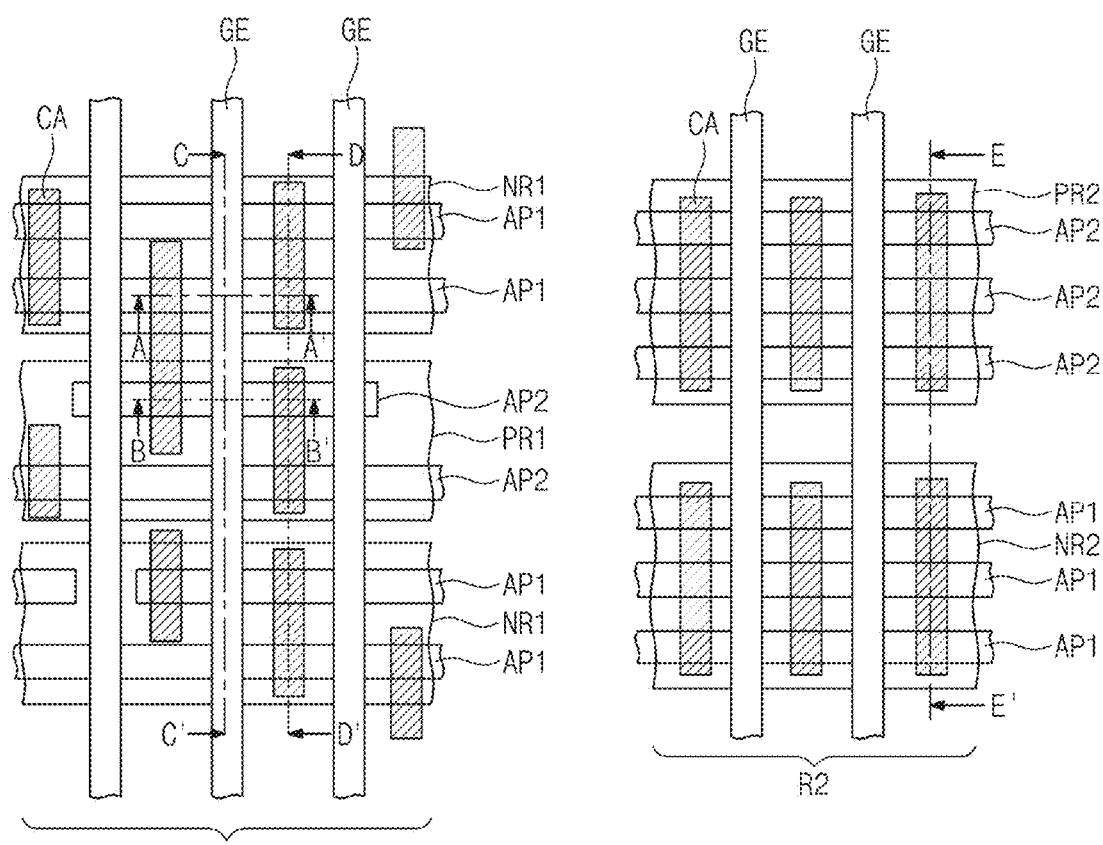
FIG. 1 is a plan view illustrating a semiconductor device according to some example embodiments of the inventive concepts.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

The inventive concepts will now be described more fully hereinafter with reference to the accompanying drawings, in which example embodiments of the inventive concepts are shown. The inventive concepts and methods of achieving them will be apparent from the following example embodiments that will be described in more detail with reference to the accompanying drawings. Example embodiments of the inventive concepts may, however, be embodied in different forms and should not be constructed as limited to the embodiments set forth herein. Rather, these embodiments are provided so that this disclosure will be thorough and complete, and will fully convey the scope of the inventive concepts to those skilled in the art.

As used herein, the singular terms "a," "an" and "the" are intended to include the plural forms as well, unless the context clearly indicates otherwise. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present. In contrast, the term "directly" means that there are no intervening elements. Additionally, the embodiment in the detailed description will be described with sectional views as ideal example views of the inventive concepts. Accordingly, shapes of the example views may be modified according to manufacturing techniques and/or allowable errors. Therefore, the embodiments of the inventive concepts are not limited to the specific shape illustrated in the example views, but may include other shapes that may be created according to manufacturing processes.

Example embodiments of the present inventive concepts explained and illustrated herein include their complementary counterparts. The same reference numerals or the same reference designators denote the same elements throughout the specification.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements or layers should be interpreted in a like fashion (e.g., "between" versus "directly between," "adjacent" versus "directly adjacent," "on" versus "directly on"). As used herein the term "and/or" includes any and all combinations of one or more of the associated listed items.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof. Expressions such as "at least one of," when preceding a list of elements, modify the entire list of elements and do not modify the individual elements of the list.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an etched region or an implanted region illustrated as a rectangle may have rounded or curved features. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which the inventive concepts belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a plan view illustrating a semiconductor device according to some example embodiments of the inventive concepts. FIGS. 2A to 2D are sectional views taken along lines A-A', B-B', C-C', D-D', and E-E' of FIG. 1.

Referring to FIGS. 1 and 2A to 2D, a substrate 100 with a first region R1 and a second region R2 may be provided. The substrate 100 may be a semiconductor substrate. In example embodiments, the substrate 100 may be a silicon substrate, a germanium substrate, or a silicon-on-insulator (SOI) substrate. The first region R1 may be a part of a memory cell region, on which a plurality of memory cells for storing data are provided. As an example, a plurality of 6T SRAM cells, each of which includes six transistors, may be provided on the first region R1. The second region R2 may be a part of a logic cell region, on which logic transistors constituting a logic circuit are provided. As an example, logic transistors for a processor core or I/O terminals may be provided on the second region R2. But, the inventive concepts are not limited thereto. Hereinafter, the first region R1 will be described in more detail.

Referring back to FIGS. 1 and 2A to 2C, the first region R1 may include a first NMOSFET region NR1 and a first PMOSFET region PR1. The first NMOSFET region NR1 may be an active region for an n-type transistor, and the first PMOSFET region PR1 may be an active region for a p-type transistor. In example embodiments, the substrate 100 may include a plurality of the first NMOSFET regions NR1 and a plurality of the first PMOSFET regions PR1 which are arranged in a first direction D1.

Active patterns AP1 and AP2 may be provided on the first region R1. For example, first active patterns AP1 protruding from the substrate 100 may be provided on the first NMOSFET region NR1 of the first region R1. The first active patterns AP1 may be arranged in the first direction D1 and may be line-shaped structures extending in a second direction D2 crossing the first direction D1.

Second active patterns AP2 protruding from the substrate 100 may be provided on the first PMOSFET region PR1 of the first region R1. The second active patterns AP2 may be arranged in the first direction D1 and may be line-shaped structures extending in the second direction D2. Widths of the first and second active patterns AP1 and AP2 may increase with increasing distance from the substrate 100, when measured in the first direction D1.

The active patterns AP1 and AP2 on the first region R1 may be spaced apart from each other in the first direction D1, and distances between the active patterns AP1 and AP2 may be different from each other. For example, a pitch between the first active patterns AP1 on the first NMOSFET region NR1 may be a first length L1, when measured in the first direction D1. A pitch between the second active patterns AP2 on the first PMOSFET region PR1 may be a second length L2, when measured in the first direction D1. A pitch between an adjacent pair of the first and second active patterns AP1 and AP2 may be a third length L3, when measured in the first direction D1. The second length L2 may be longer than the first length L1, and the third length L3 may be longer than the second length L2. Each of the first to third lengths L1, L2, and L3 may be a center-to-center distance between an adjacent pair of the active patterns.

Second device isolation patterns ST2 may be provided to fill trenches between the first active patterns AP1 and between the second active patterns AP2. In other words, the second device isolation patterns ST2 may be provided to define the first and second active patterns AP1 and AP2. The first and second active patterns AP1 and AP2 may include first and second active fins AF1 and AF2, whose top surfaces are higher than the second device isolation patterns ST2.

First device isolation patterns ST1 may be provided at opposite sides of the first NMOSFET region NR1 and the first PMOSFET region PR1. The first device isolation patterns ST1 may be provided to separate the first NMOSFET regions NR1 and the first PMOSFET region PR1 shown in FIG. 2 from other MOSFET regions.

The first and second device isolation patterns ST1 and ST2 may be substantially connected to each other to form a single insulating pattern. A thickness of the first device isolation patterns ST1 may be greater than that of the second device isolation patterns ST2. In example embodiments, the first and second device isolation patterns ST1 and ST2 may be formed by different processes. In example embodiments, the first and second device isolation patterns ST1 and ST2 may be formed at the same time using the same process and may have substantially the same thickness. The first and second device isolation patterns ST1 and ST2 may be formed in an upper portion of the substrate 100. The first and second device isolation patterns ST1 and ST2 may be formed of or include a silicon oxide layer.

Each of the second device isolation patterns ST2 may include a first portion P1, which is provided below a gate electrode GE to be described below and second portions P2, which are provided at opposite sides of the gate electrode GE. Each of the second portions P2 of the second device isolation patterns ST2 may have a recessed top surface. For example, the second portions P2 may be provided to define recess regions RS1, RS2, and RS3. Referring back to FIG. 2C, the recess regions RS1, RS2, and RS3 may include first recess regions RS1 between the first active patterns AP1, second recess regions RS2 between the second active patterns AP2, and third recess regions RS3 between the first and second active patterns AP1 and AP2 adjacent to each other.

The first to third recess regions RS1-RS3 may be provided to have a recess depth that is dependent on a pattern density. For example, the recess depth may be smaller between the first active patterns AP1 spaced at a small distance than between the active patterns spaced at a larger distance. As an example, bottom surfaces of the first recess regions RS1 may be higher than those of the second recess regions RS2. This may be because that the second length L2 is longer than the first length L1. In addition, the bottom surfaces of the second recess regions RS2 may be higher than those of the third recess regions RS3. This may be because that the third length L3 is longer than the second length L2.

Gate electrodes GE may be provided on the first and second active patterns AP1 and AP2 to extend in the first direction D1 and to cross the first and second active patterns AP1 and AP2. The gate electrodes GE may cover top and side surfaces of the first and second active patterns AP1 and AP2. The gate electrodes GE may be spaced apart from each other in the second direction D2. The gate electrodes GE may extend in the first direction D1 to cross both of the first and second device isolation patterns ST1 and ST2.

Interface layers IL may be respectively interposed between the first and second active patterns AP1 and AP2 and the gate electrodes GE. A gate insulating pattern GI may be provided between a corresponding pair of the interface layers IL and the gate electrodes GE. Gate spacers GS may be provided at opposite sides of each of the gate electrodes GE. A capping pattern GP may be provided to cover a top surface of each of the gate electrodes GE. The interface layer IL may directly cover top surfaces of the active patterns AP1 and AP2 (e.g., top surfaces of channel regions CH1 and CH2 to be described below). The gate insulating pattern GI may be disposed between the gate electrode GE and the gate spacers GS. The gate insulating pattern GI may be horizontally extended from the active patterns AP1 and AP2 along the gate electrode GE to directly cover top surfaces of the first portions P1 of the second device isolation patterns ST2.

In example embodiments, although not shown, the gate spacers GS may have an 'L'-shaped section, when viewed in a sectional view taken in the second direction D2. For example, each of the gate spacers GS may include a vertical portion covering a side surface of the gate electrode GE and a horizontal portion covering the top surface of the active pattern AP1 or AP2.

The gate electrodes GE may include at least one of doped semiconductor materials, conductive metal nitrides (e.g., titanium nitride or tantalum nitride), or metals (e.g., aluminum or tungsten). The interface layer IL may include a silicon oxide layer. The gate insulating patterns GI may include at least one of a silicon oxide layer, a silicon oxynitride layer, and high-k dielectric layers (e.g., hafnium oxide, hafnium silicate, zirconium oxide, or zirconium silicate) having dielectric constants higher than that of the silicon oxide layer. Each of the capping patterns GP and the gate spacers GS may include at least one of a silicon oxide layer, a silicon nitride layer, or a silicon oxynitride layer.

Source/drain regions SD1 and SD2 may be provided on the first and second active patterns AP1 and AP2 positioned at opposite sides of each of the gate electrodes GE. For example, first source/drain regions SD1 may be provided on the first active patterns AP1 at opposite sides of each of the gate electrodes GE. Second source/drain regions SD2 may be provided on the second active patterns AP2 at opposite sides of each of the gate electrodes GE. As an example, the first source/drain regions SD1 on the first NMOSFET region NR1 may have n-type conductivity, and the second source/drain regions SD2 on the first PMOSFET region PR1 may have p-type conductivity.

The first active fins AF1 on the first active patterns AP1 may have first channel regions CH1 interposed between the first source/drain regions SD1. The second active fins AF2 on the second active patterns AP2 may have second channel regions CH2 interposed between the second source/drain regions SD2. Each of the first channel regions CH1 may connect a pair of the first source/drain regions SD1 with each other. Each of the second channel regions CH2 may connect a pair of the second source/drain regions SD2 with each other. The first and second channel regions CH1 and CH2 may be positioned below and overlapped with the gate electrodes GE.

The first and second source/drain regions SD1 and SD2 may be epitaxial patterns, which are respectively grown using the first and second active patterns AP1 and AP2 as a seed layer. In example embodiments, the first source/drain regions SD1 may include a material capable of exerting a tensile strain to the first channel regions CH1, and the second source/drain regions SD2 may include a material capable of exerting a compressive strain to the second channel regions CH2. For example, in the case where the substrate 100 is a silicon substrate, the first source/drain regions SD1 may include a SiC layer having a lattice constant smaller than Si or a Si layer having substantially the same lattice constant as the substrate 100. The second source/drain region SD2 may include a SiGe layer having a lattice constant larger than Si.

Figure 2A:
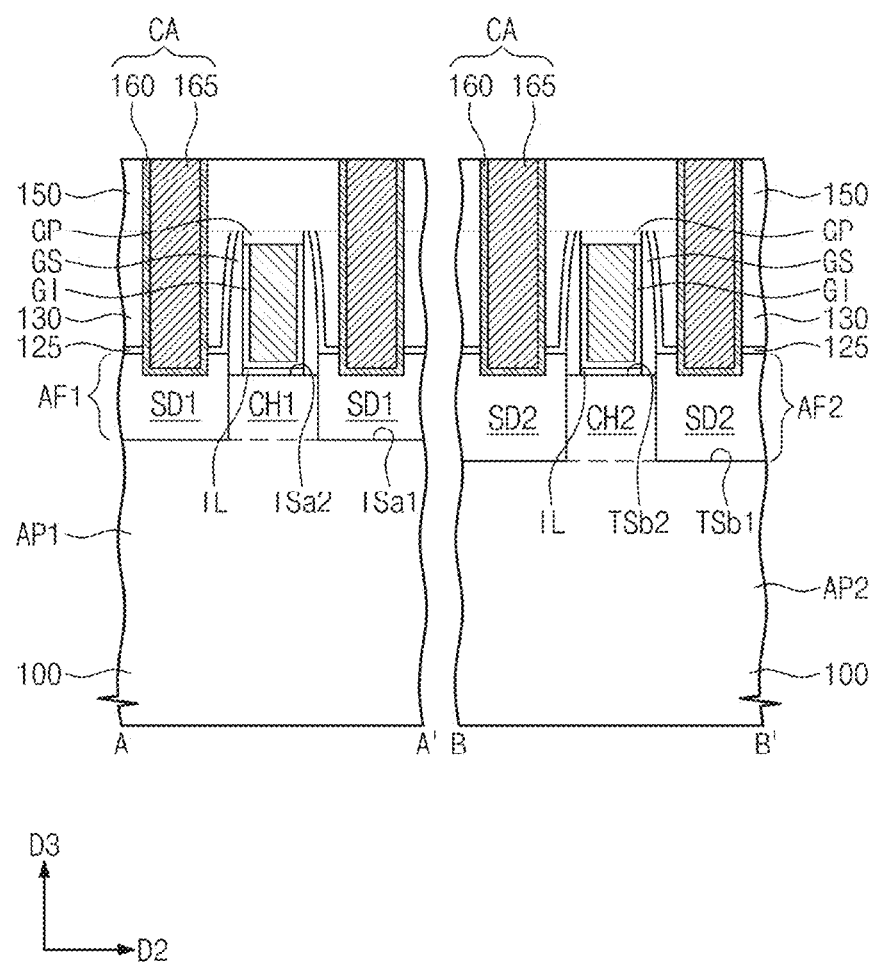
FIGS. 2A to 2D are sectional views taken along lines A-A', B-B', C-C', D-D', and E-E' of FIG. 1.
Figure 2B:
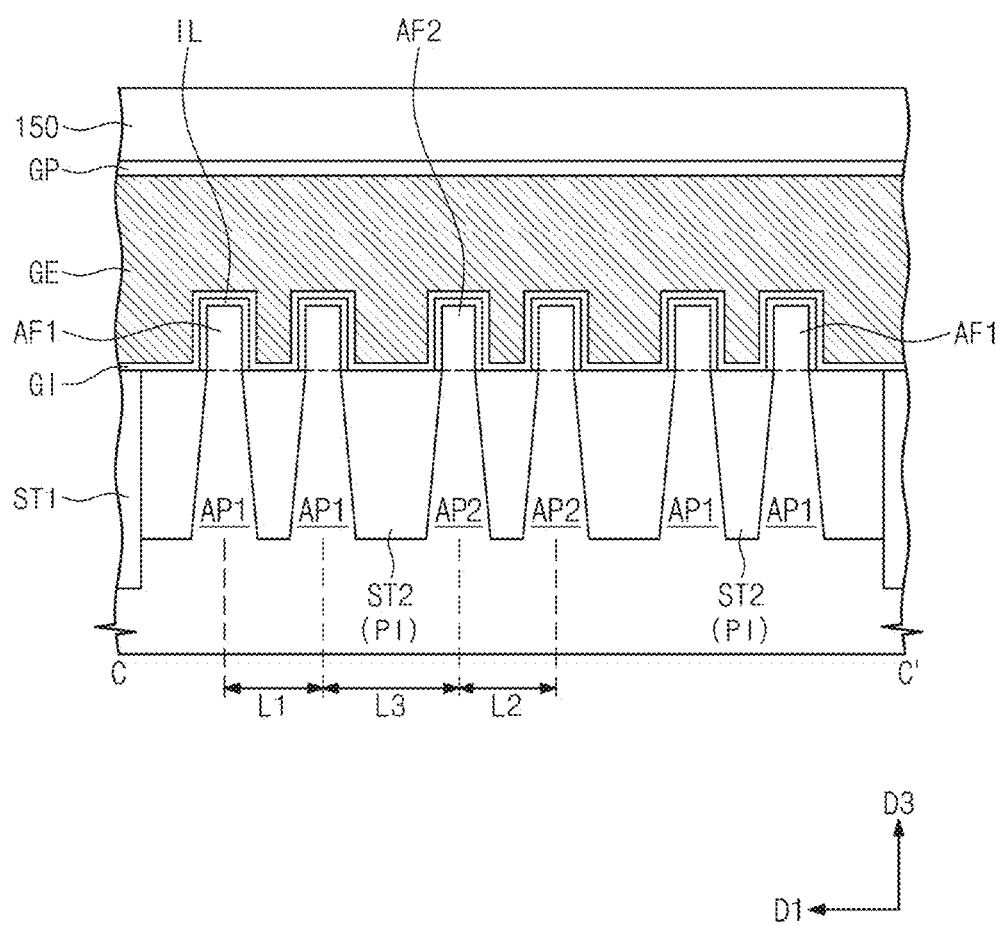
Figure 2C:
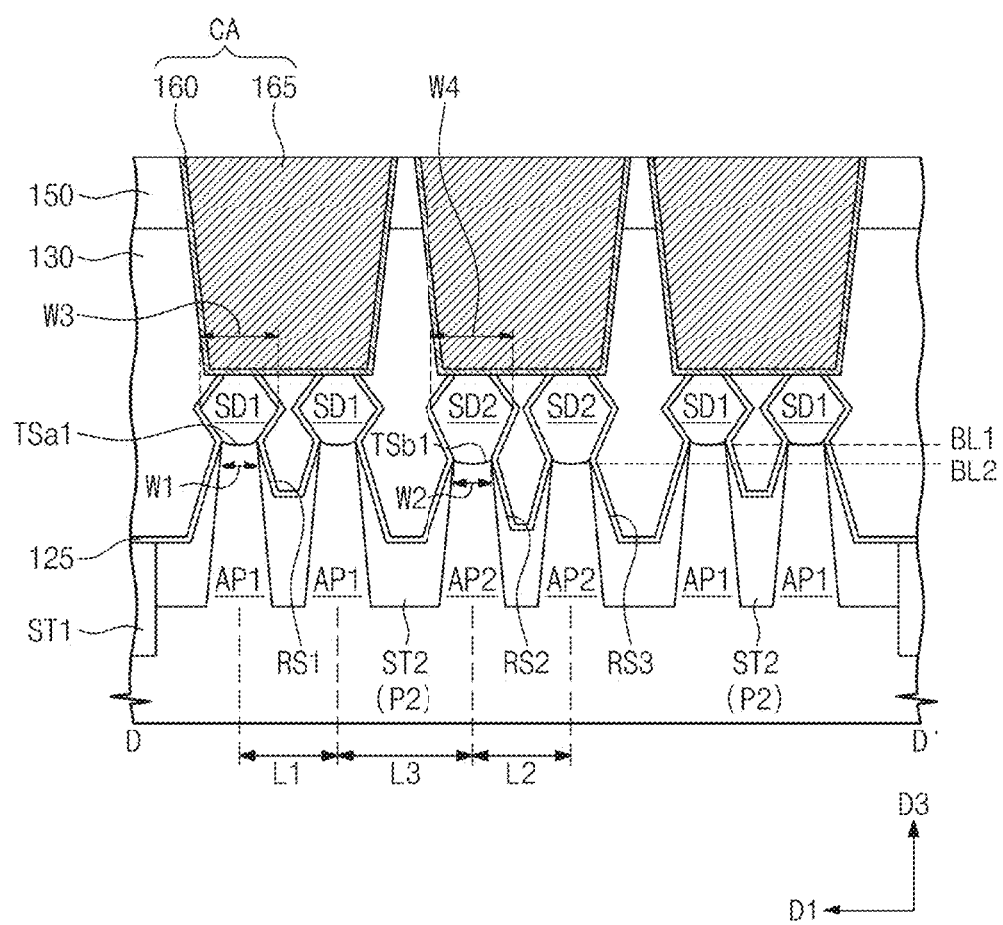
Figure 2D:
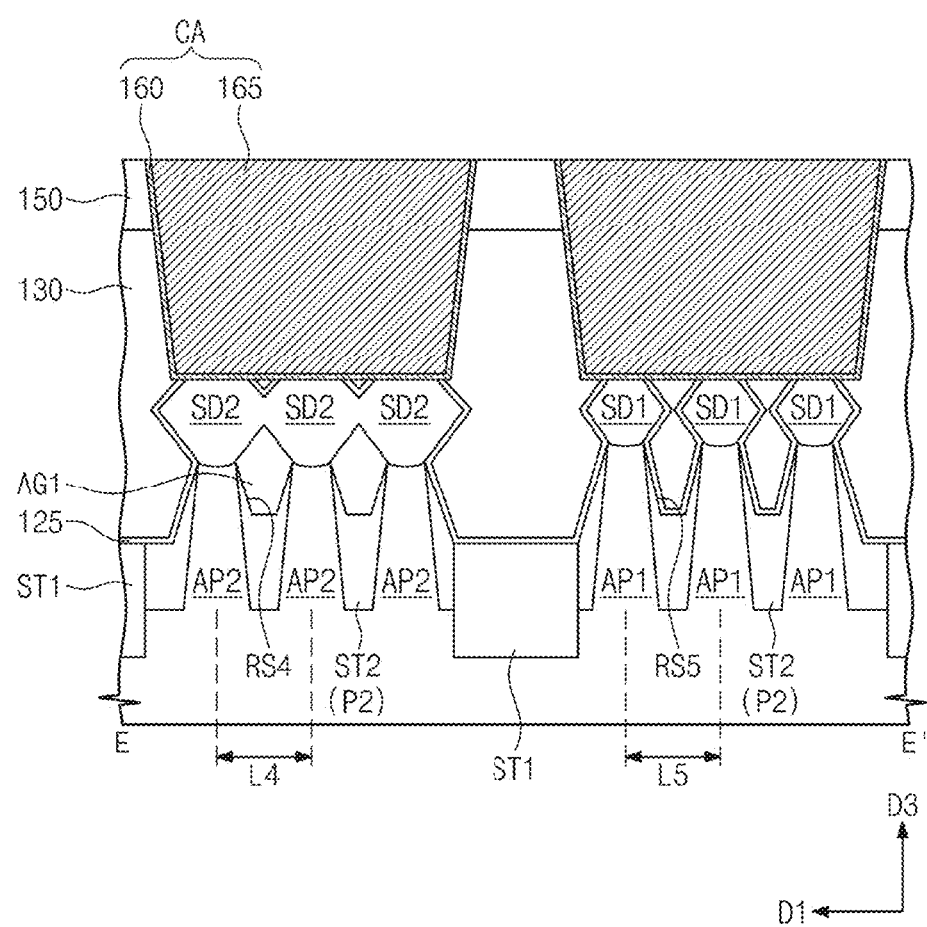

In a sectional view, the first source/drain regions SD1 may have a different shape from the second source/drain regions SD2, as shown in FIG. 2C. As described above, this is because the first and second source/drain regions SD1 and SD2 are formed of different materials grown through an epitaxial growth process. For example, the maximum width in the first direction D1 of the first source/drain regions SD1 may be a third width W3, and the maximum width in the first direction D1 of the second source/drain regions SD2 may be a fourth width W4 that is different from the third width W3.

In example embodiments, the first source/drain regions SD1 may be provided to have the maximum widths W3 different from each other. For example, in the case where the first source/drain regions SD1 are formed of Si, the first source/drain regions SD1 may grow in an irregular manner. As a result, the first source/drain region SD1 may have a shape or size which varies depending on its position. In addition, although, in FIG. 2C, the fourth width W4 is illustrated to be greater than the third width W3, but the inventive concepts are not limited thereto. For example, the third width W3 may be greater than the fourth width W4.

The bottom surfaces of the first source/drain regions SD1 may be positioned at a first level BL1, and the bottom surfaces of the second source/drain regions SD2 may be positioned at a second level BL2. Here, the first level BL1 may be higher than the second level BL2. In addition, both of the first and second levels BL1 and BL2 may be higher than the bottom surfaces of the recess regions RS1-RS3.

The first active patterns AP1 may include first top surfaces TSa1, which are in direct contact with the bottom surfaces of the first source/drain regions SD1, and second top surfaces TSa2, which serve as top surfaces of the first channel regions CH1. The second active patterns AP2 may include first top surfaces TSb1, which are in direct contact with the bottom surfaces of the second source/drain regions SD2, and second top surfaces TSb2, which serve as top surfaces of the second channel regions CH2. The first top surfaces TSa1 and TSb1 of the first and second active patterns AP1 and AP2 may not be flat and may have a downward curved or rounded profile. Here, the first top surfaces TSa1 and TSb1 may be lower than the second top surfaces TSa2 and TSb2.

The first top surface TSa1 of the first active pattern AP1 may have a first width W1 and the first top surface TSb1 of the second active pattern AP2 may have a second width W2, when measured in the first direction D1. Here, the second width W2 may be greater than the first width W1. This is because the first and second active patterns AP1 and AP2 have downward increasing widths and the first top surface TSb1 of the second active pattern AP2 is positioned below the first top surface TSa1 of the first active pattern AP1.

Because the second source/drain regions SD2 are grown using the first top surfaces TSb1 of the second active patterns AP2 as a seed layer, the second source/drain regions SD2 may have a volume that is relatively larger than that of the first source/drain regions SD1. This configuration may allow for an increase in a magnitude of the compressive strain to be exerted to the second channel regions CH2 from the second source/drain regions SD2 and an increase in a contact area between the second source/drain regions SD2 and the second channel regions CH2. Accordingly, increasing carrier mobility of the second channel regions CH2 and reducing resistance of the second channel regions CH2 may be possible.

An etch stop layer 125 may be provided on the substrate 100. The etch stop layer 125 may cover top surfaces of the first and second device isolation patterns ST1 and ST2. For example, the etch stop layer 125 may cover inner surfaces of the recess regions RS1-RS3 of the second device isolation patterns ST2. In addition, the etch stop layer 125 may cover the first and second source/drain regions SD1 and SD2 and may extend to cover opposite side surfaces of the gate spacers GS. The etch stop layer 125 may include a material having an etch selectivity with respect to a first interlayered insulating layer 130. As an example, the etch stop layer 125 may include a silicon nitride layer or a silicon oxynitride layer.

The first interlayered insulating layer 130 may be provided on the substrate 100 to fill gap regions between the gate electrodes GE. The first interlayered insulating layer 130 may have a top surface that substantially coplanar with those of the capping patterns GP. In some example embodiments, the first interlayered insulating layer 130 may fill the recess regions RS1-RS3 provided with the etch stop layer 125. A second interlayered insulating layer 150 may be provided on the first interlayered insulating layer 130. The first and second interlayered insulating layers 130 and 150 may be formed of or include a silicon oxide layer.

Source/drain contacts CA may be provided at opposite sides of each of the gate electrodes GE. The source/drain contacts CA may be provided to pass through the second interlayered insulating layer 150, the first interlayered insulating layer 130, and the etch stop layer 125 and may be electrically connected to the first and second source/drain regions SD1 and SD2. When viewed in a plan view, each of the source/drain contacts CA may be provided to cross at least one of the first active patterns AP1 or at least one of the second active patterns AP2.

Each of the source/drain contacts CA may include a first conductive pattern 160 and a second conductive pattern 165 on the first conductive pattern 160. The first conductive pattern 160 may be a barrier conductive layer. As an example, the first conductive pattern 160 may include at least one of a titanium nitride layer, a tungsten nitride layer, or a tantalum nitride layer. The second conductive pattern 165 may be a metal layer. As an example, the second conductive pattern 165 may include at least one of tungsten, titanium, or tantalum. Although not shown, a metal silicide layer may be interposed between each pair of the source/drain contacts CA and the first and second source/drain regions SD1 and SD2. The metal silicide layer may include at least one of titanium silicide, tantalum silicide, or tungsten silicide.

Hereinafter, the second region R2 will be described in more detail. For concise description, an element described with reference to the first region R1 may be identified by a similar or identical reference number without repeating an overlapping description thereof. A vertical section of the second region R2 taken in the second direction D2 may be similar to that of the first region R1 described with reference to FIG. 2A.

Referring back to FIGS. 1 and 2D, the second region R2 may include a second NMOSFET region NR2 and a second PMOSFET region PR2. In some example embodiments, n-type transistors may be integrated on the second NMOSFET region NR2, and p-type transistors may be integrated on the second PMOSFET region PR2. The second region R2 may include a plurality of the second NMOSFET regions NR2 and a plurality of the second PMOSFET regions PR2 which are arranged in the first direction D1. The second NMOSFET region NR2 may be separated from the second PMOSFET region PR2 by the first device isolation patterns ST1.

Active patterns AP1 and AP2 may be provided on the second region R2. For example, the first active patterns AP1 protruding from the substrate 100 may be provided on the second NMOSFET region NR2 of the second region R2, and the second active patterns AP2 protruding from the substrate 100 may be provided on the second PMOSFET region PR2 of the second region R2.

The first and second active patterns AP1 and AP2 on the second region R2 may be spaced apart from each other by substantially the same space. As an example, when measured in the first direction D1, a pitch between the second active patterns AP2 on the second PMOSFET region PR2 may be a fourth length L4 and a pitch between the first active patterns AP1 on the second NMOSFET region NR2 may be a fifth length L5. Here, the fourth length L4 may be substantially equal to the fifth length L5. The fourth length L4 may be smaller than the second length L2 described above.

The second device isolation patterns ST2 may be provided to fill trenches between the first active patterns AP1 and trenches between the second active patterns AP2 on the second region R2. Each of the second portions P2 of the second device isolation patterns ST2 may have a recessed top surface. In other words, the second portions P2 may be provided to define recess regions RS4 and RS5. Referring back to FIG. 2D, the recess regions RS4 and RS5 may include fourth recess regions RS4 between the second active patterns AP2 and fifth recess regions RS5 between the first active patterns AP1. Here, the fourth recess regions RS4 and the fifth recess regions RS5 may have substantially the same recess depth. This is because the first and second active patterns AP1 and AP2 are spaced apart from each other by substantially the same space, unlike the first region R1. In addition, the second recess regions RS2 on the first region R1 may be provided to have a recess depth greater than that of the fourth recess regions RS4. In certain embodiments, the first device isolation patterns ST1 may have top surfaces, which are recessed at a recess depth greater than the fourth and fifth recess regions RS4 and RS5.

On the first and second active patterns AP1 and AP2 of the second region R2, the gate electrodes GE may be provided to cross the first and second active patterns AP1 and AP2 and extend in the first direction D1. The gate insulating pattern GI may be provided below each of the gate electrodes GE, and the gate spacers GS may be provided at opposite sides of each of the gate electrodes GE. In addition, the capping pattern GP may be provided to cover the top surface of each of the gate electrodes GE.

The first and second source/drain regions SD1 and SD2 may be provided on the first and second active patterns AP1 and AP2 and at opposite sides of each of the gate electrodes GE. In the meantime, the second source/drain regions SD2 on the first region R1 may be arranged spaced apart from each other in the first direction D1. However, the second source/drain regions SD2 on the second region R2 may be merged to each other to form a single source/drain region extending in the first direction D1. This is because a space between the second active patterns AP2 on the second region R2 is smaller than a space between the second active patterns AP2 on the first region R1 (i.e., L4<L2).

The etch stop layer 125 may be provided on the second region R2. The etch stop layer 125 may cover the top surfaces of the first and second device isolation patterns ST1 and ST2 and the first and second source/drain regions SD1 and SD2. The etch stop layer 125 may not cover inner surfaces of the fourth recess regions RS4. This may be because the second source/drain regions SD2 are merged to each other. By contrast, the etch stop layer 125 may be provided to cover inner surfaces of the fifth recess regions RS5.

The first interlayered insulating layer 130 may be provided on the second region R2 to fill gap regions between the gate electrodes GE. The first interlayered insulating layer 130 may fill the fifth recess regions RS5 provided with the etch stop layer 125. By contrast, the fourth recess regions RS4 may not be filled with the first interlayered insulating layer 130. In other words, first air gaps AG1 may be formed in the fourth recess regions RS4, respectively, which are positioned below the second source/drain regions SD2. The first air gaps AG1 may be a region in which a solid material is not provided and may be a substantially empty space. For example, the first air gaps AG1 may be directly enclosed by the second source/drain regions SD2 and the second device isolation patterns ST2. In other words, the first air gaps AG1 may not be enclosed by the etch stop layer 125. Because the first air gaps AG1 are provided below the second source/drain regions SD2, reducing parasitic capacitance between the second active patterns AP2 may be possible.

The source/drain contacts CA may be provided at opposite sides of each of the gate electrodes GE. The source/drain contacts CA may be electrically connected to the first and second source/drain regions SD1 and SD2 through the second interlayered insulating layer 150, the first interlayered insulating layer 130, and the etch stop layer 125.

Figure 3:
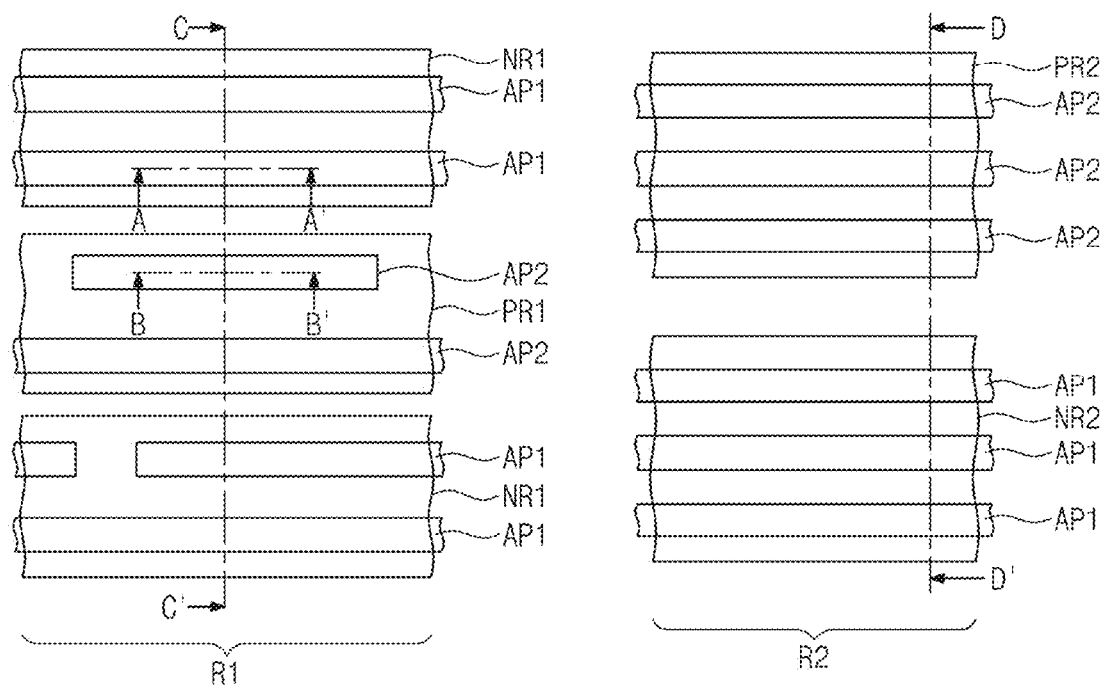
FIG. 3 is a plan view illustrating a method of fabricating a semiconductor device according to some example embodiments of the inventive concepts.
Figure 4A:
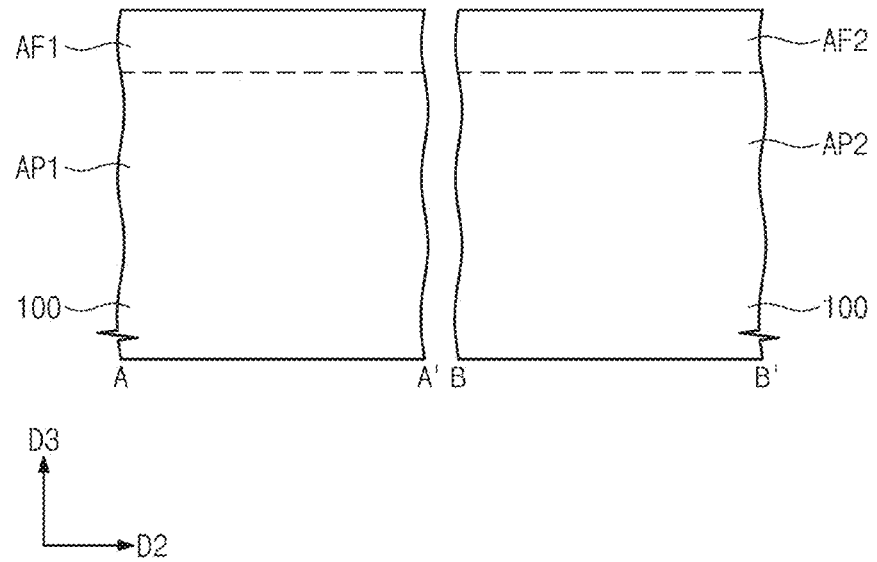
FIGS. 4A to 4C are sectional views taken along lines A-A', B-B', C-C', and D-D' of FIG. 3.
Figure 4B:
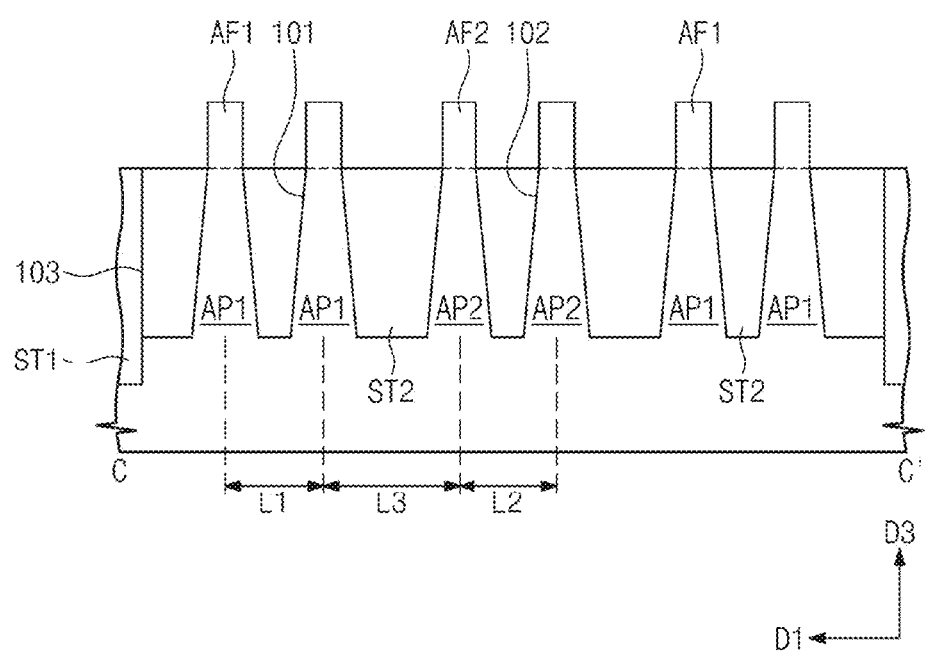
Figure 4C:
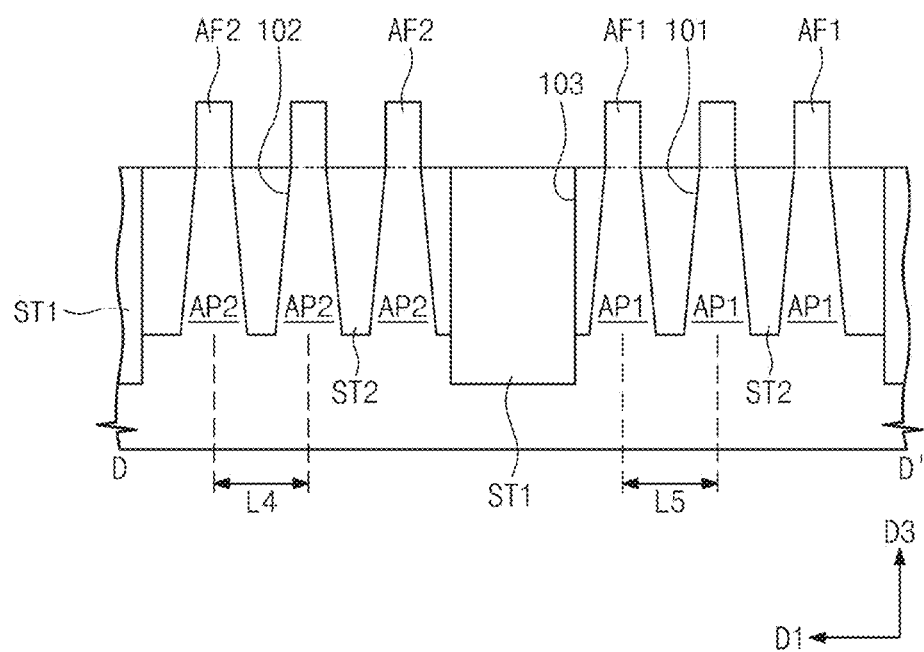
Figure 5:
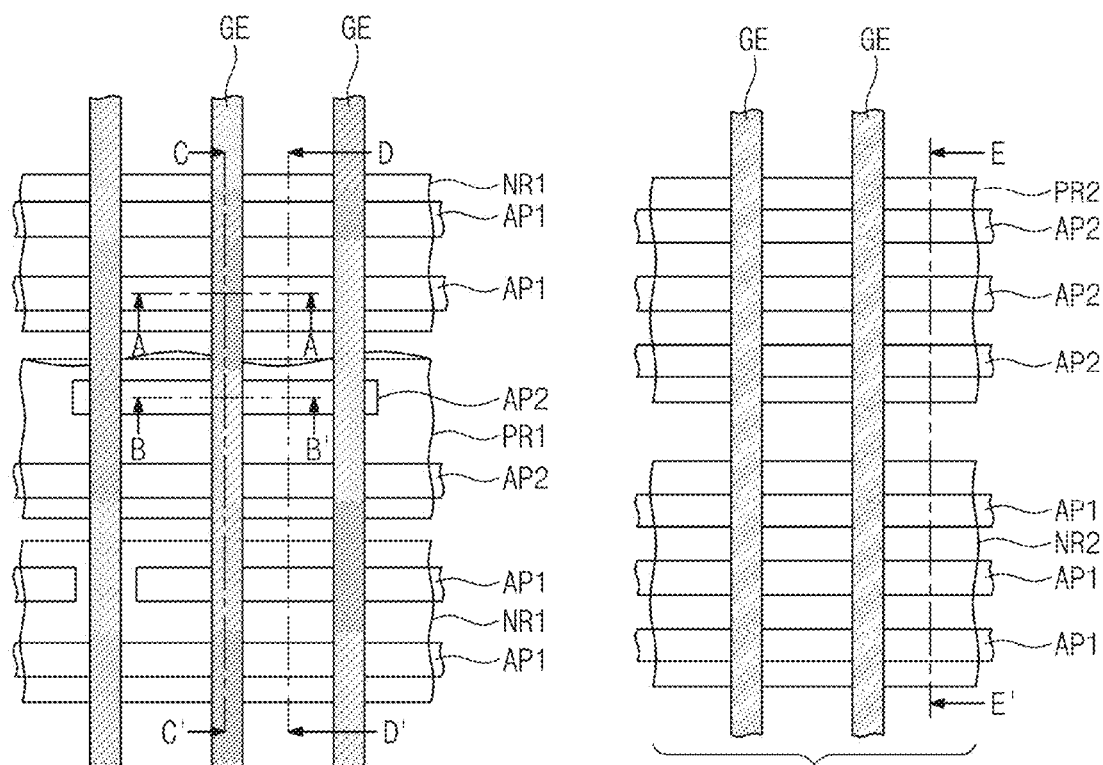
FIG. 5 is a plan view illustrating a method of fabricating a semiconductor device according to some example embodiments of the inventive concepts.
Figure 5:
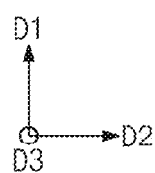
Figure 6A:
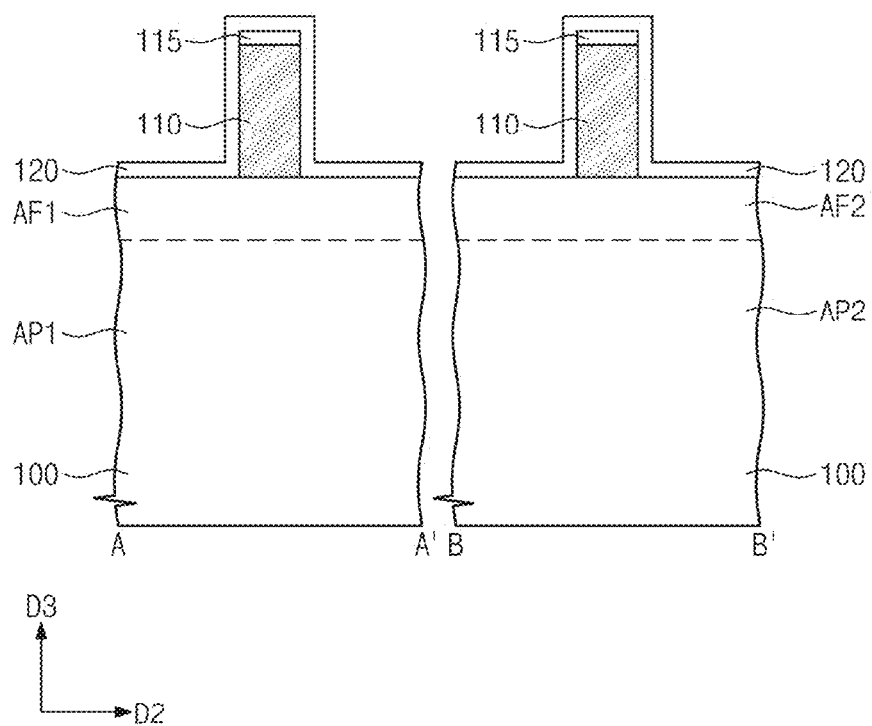
FIGS. 6A to 6D are sectional views taken along lines A-A', B-B', C-C', D-D', and E-E' of FIG. 5.
Figure 6B:
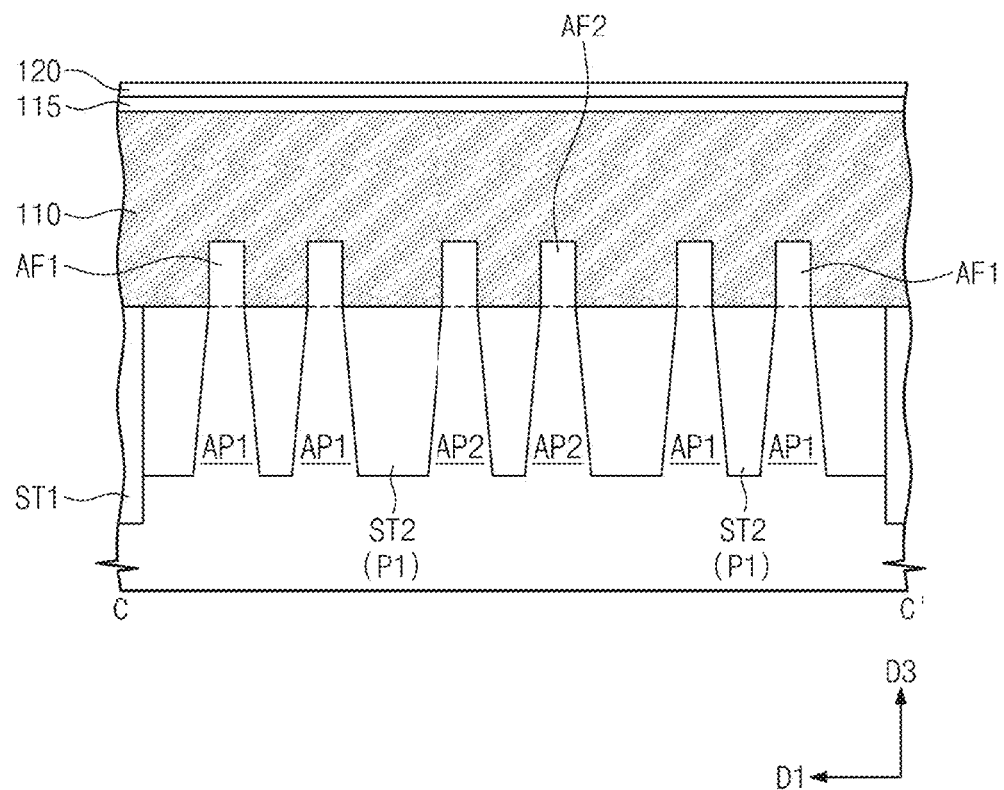
Figure 6C:
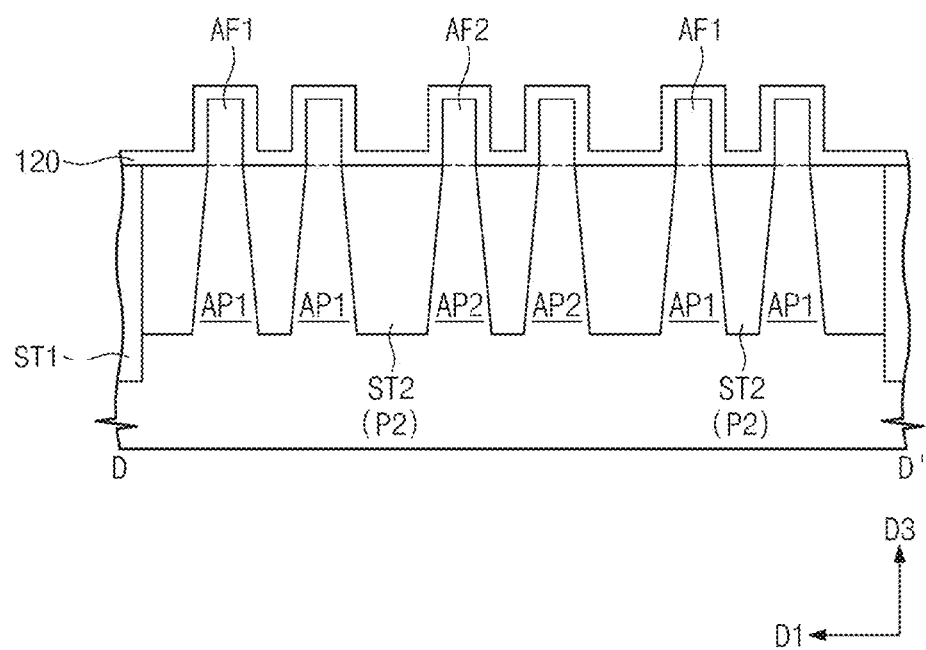
Figure 6D:
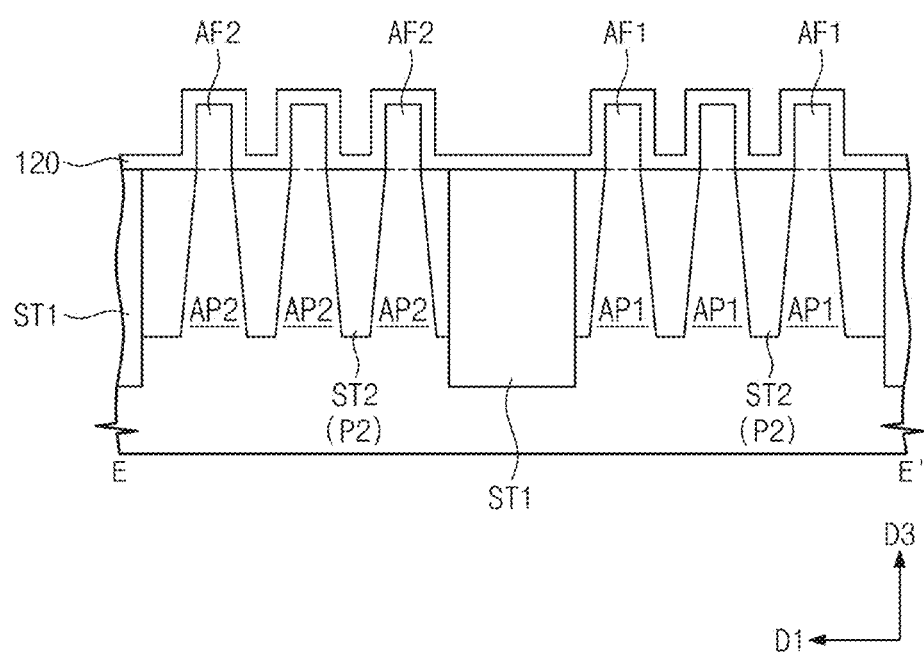
Figure 7A:
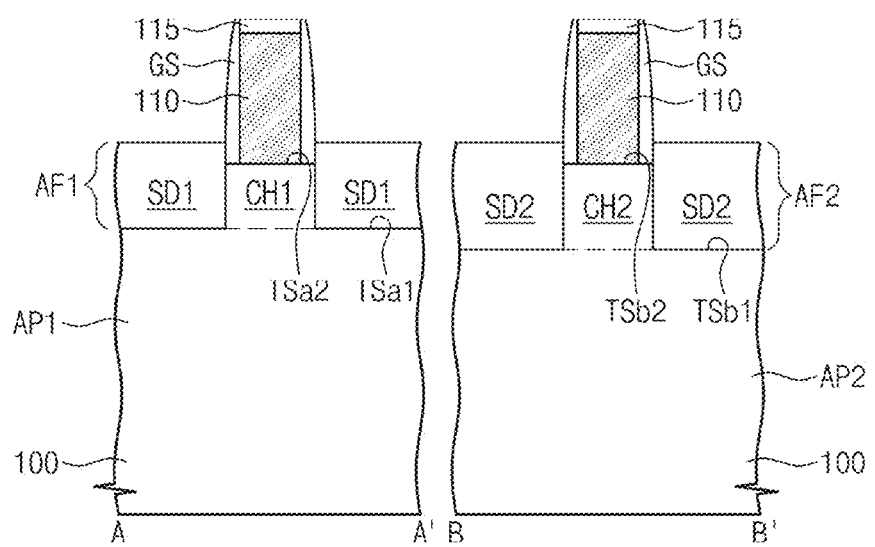
FIGS. 7A to 7D are sectional views taken along lines A-A', B-B', C-C', D-D', and E-E' of FIG. 5.
Figure 7B:
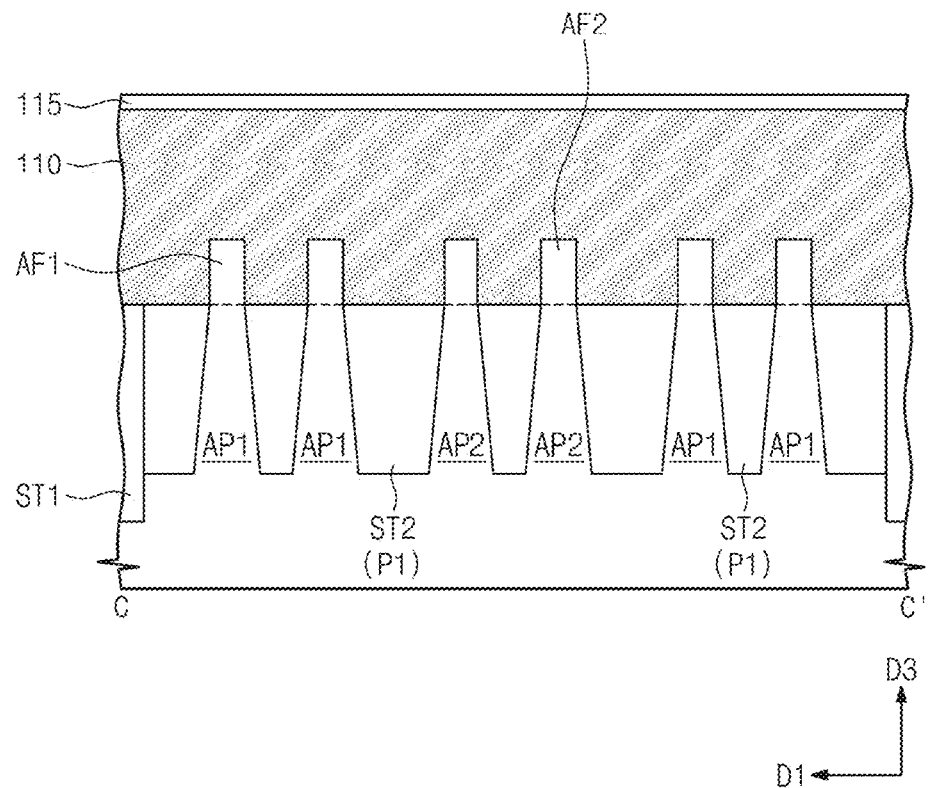
Figure 7C:
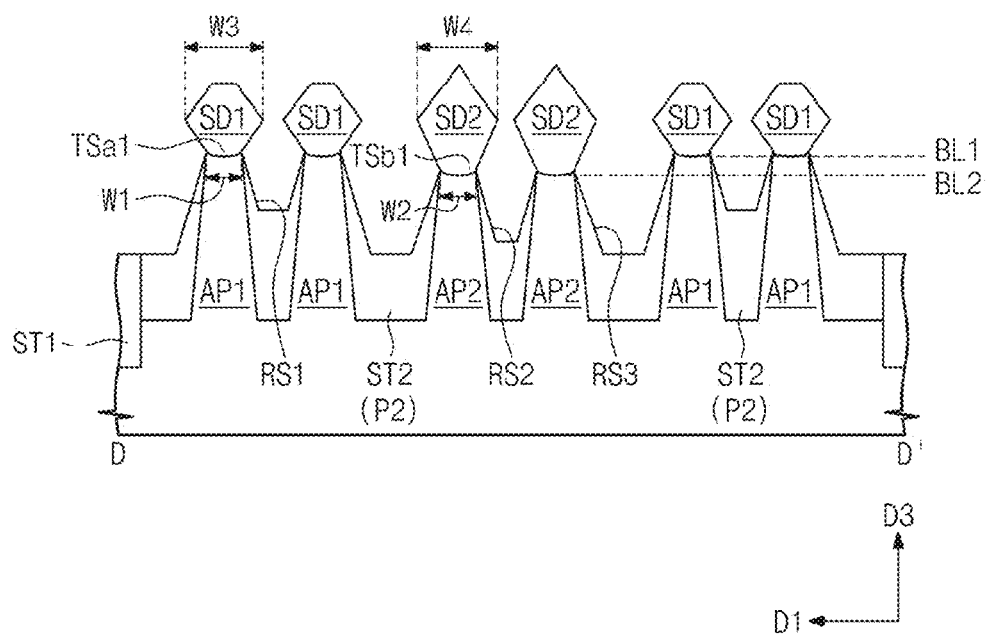
Figure 7D:
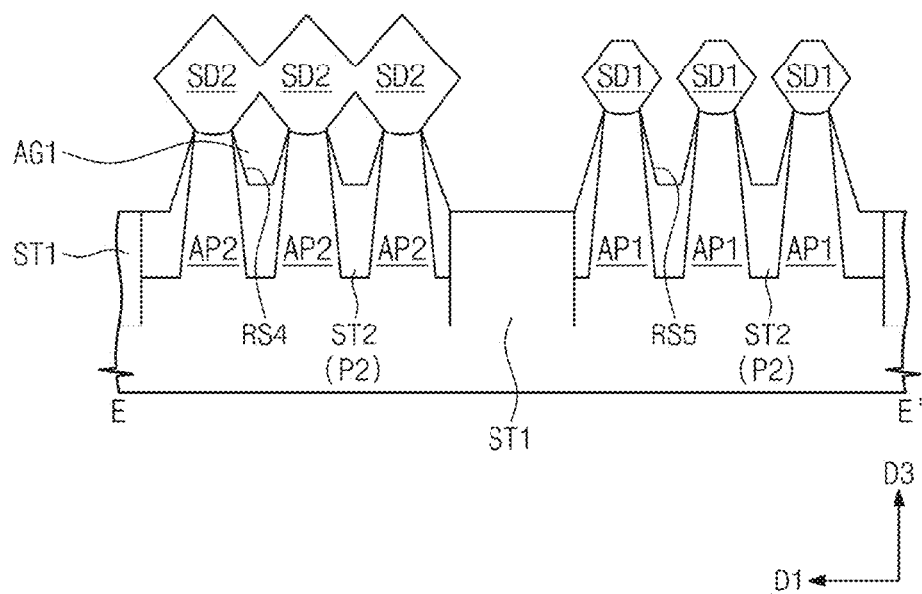
Figure 8:
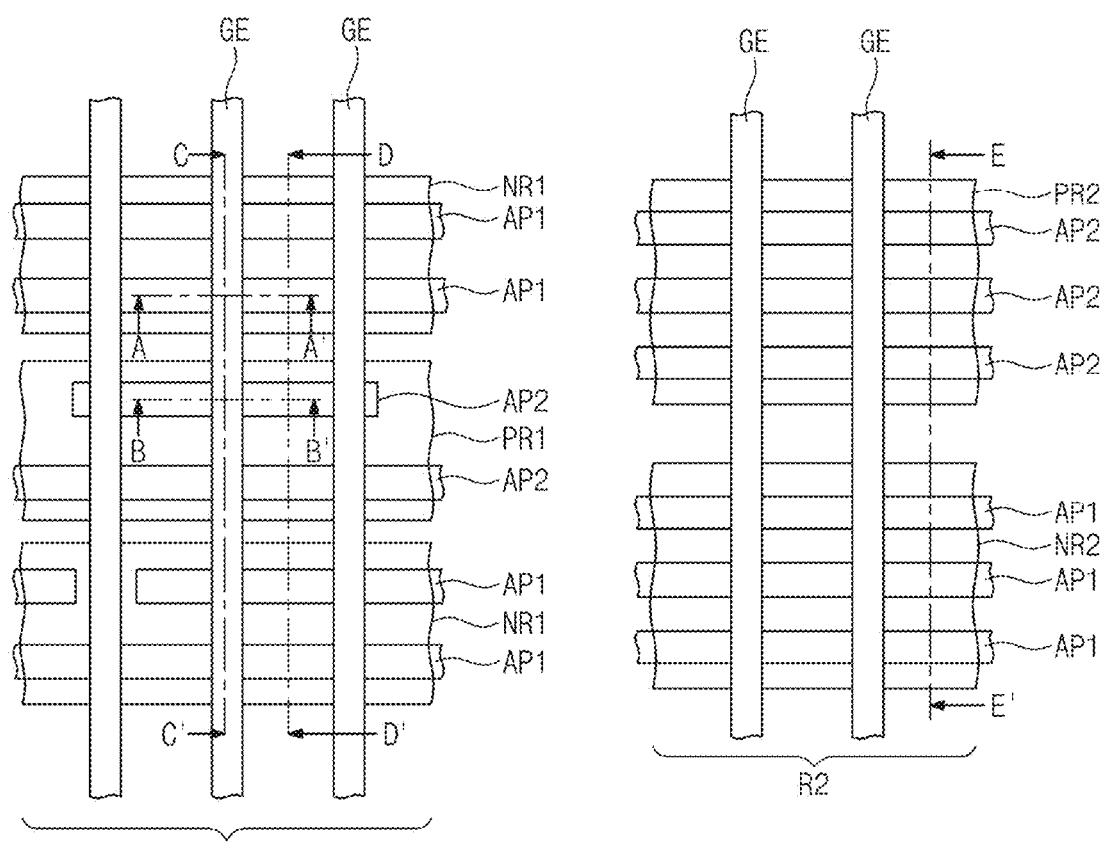
FIG. 8 is a plan view illustrating a method of fabricating a semiconductor device according to some example embodiments of the inventive concepts.
Figure 9A:
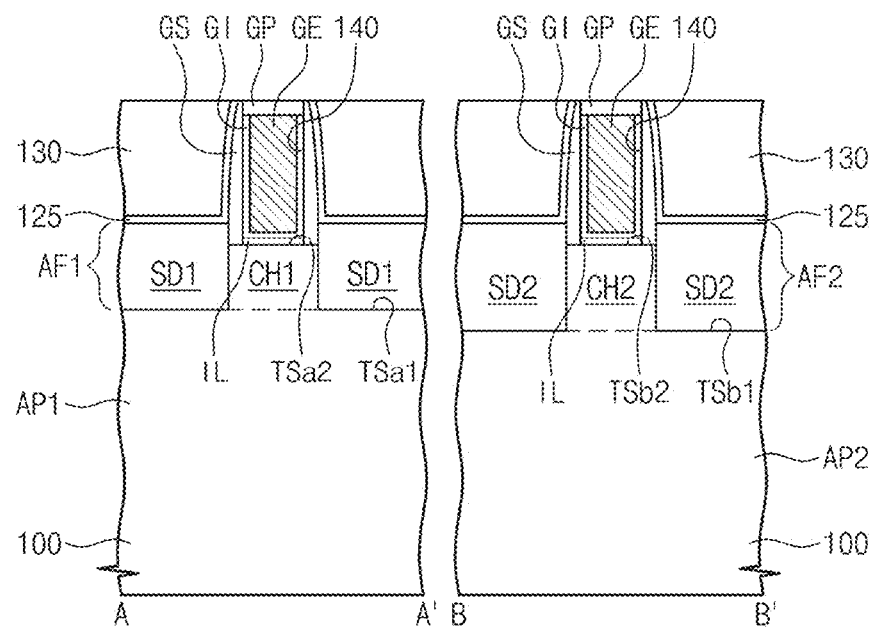
FIGS. 9A to 9D are sectional views taken along lines A-A', B-B', C-C', D-D', and E-E' of FIG. 8.
Figure 9B:
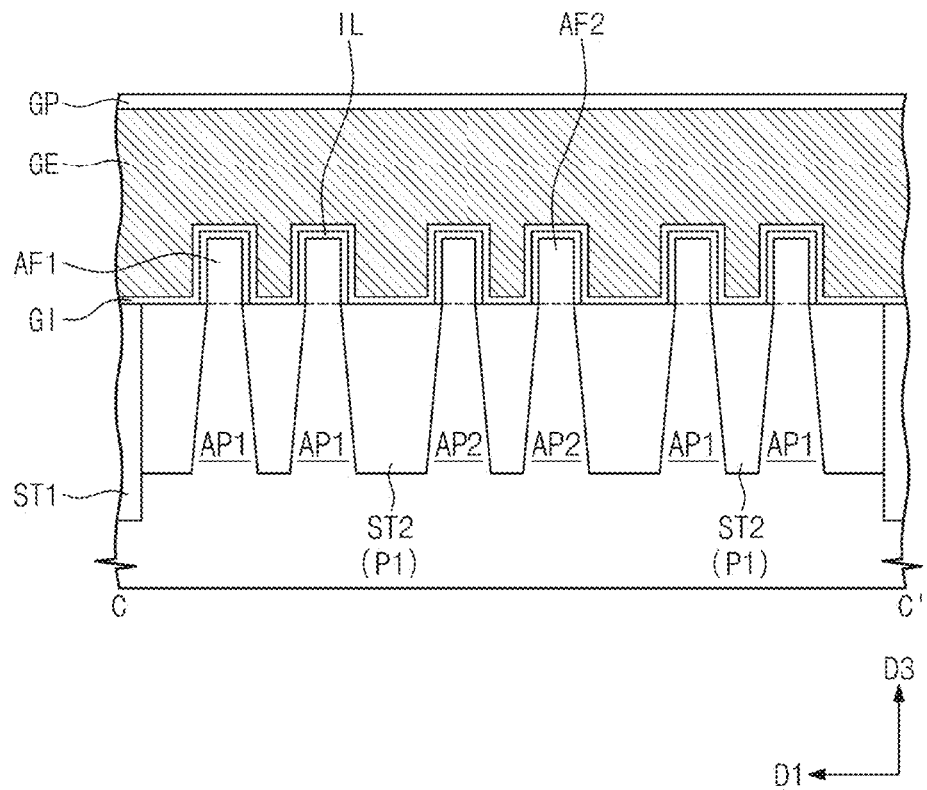
Figure 9C:
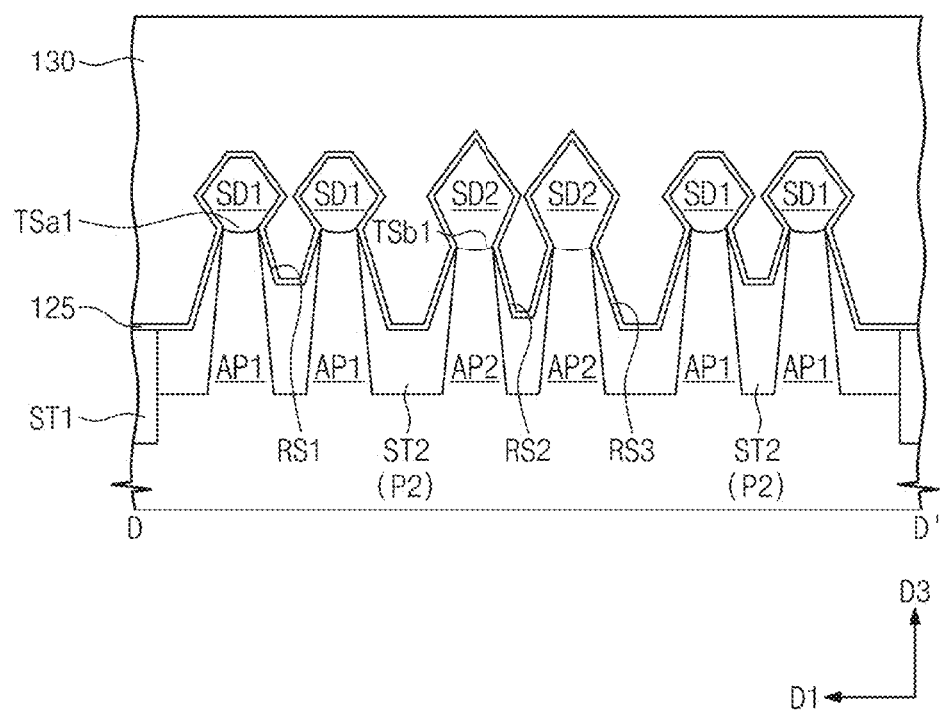
Figure 9D:
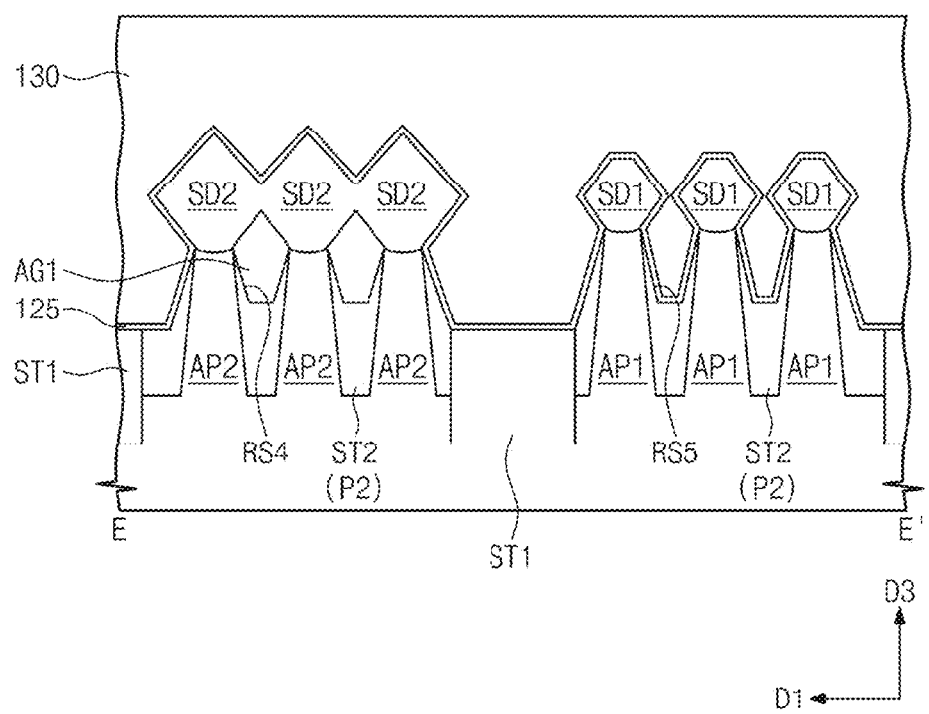

FIGS. 3, 5 and 8 are plan views illustrating a method of fabricating a semiconductor device according to some example embodiments of the inventive concepts. FIGS. 4A to 4C are sectional views taken along lines A-A', B-B', C-C', and D-D' of FIG. 3, FIGS. 6A to 6D are sectional views taken along lines A-A', B-B', C-C', D-D', and E-E' of FIG. 5, FIGS. 7A to 7D are sectional views taken along lines A-A', B-B', C-C', D-D', and E-E' of FIG. 5, and FIGS. 9A to 9D are sectional views taken along lines A-A', B-B', C-C', D-D', and E-E' of FIG. 8.

Referring to FIGS. 3 and 4A to 4C, a substrate 100 with a first region R1 and a second region R2 may be provided. In example embodiments, the substrate 100 may be a silicon substrate, a germanium substrate, or a silicon-on-insulator (SOI) substrate. The first region R1 may be a part of a memory cell region, on which a plurality of memory cells for storing data are provided, and the second region R2 may be a part of a logic cell region, on which logic transistors constituting a logic circuit are provided.

Each of the regions R1 and R2 may include NMOSFET regions NR1 and NR2 and PMOSFET regions PR1 and PR2.

In some example embodiments, each of the NMOSFET regions NR1 and NR2 may be defined as an active region on which an n-type transistor is solely integrated, and each of the PMOSFET region PR1 and PR2 may be defined as an active region on which a p-type transistor is solely integrated. In each of the regions R1 and R2, the NMOSFET regions NR1 and NR2 and the PMOSFET regions PR1 and PR2 may be arranged in a first direction D1, but the inventive concepts may not be limited thereto.

The regions R1 and R2 of the substrate 100 may be patterned to form first trenches 101 defining first active patterns AP1 and second trenches 102 defining second active patterns AP2. The first and second active patterns AP1 and AP2 may be arranged in the first direction D1 and may be line-shaped structures extending in a second direction D2 crossing the first direction D1.

The first region R1 of the substrate 100 may be again patterned to form deep trenches 103. The deep trenches 103 may be formed at opposite sides of the first NMOSFET region NR1 and the first PMOSFET region PR1. Also, the deep trenches 103 may be formed by patterning the second region R2 of the substrate 100. The deep trenches 103 may be formed to have bottom surfaces that are lower than those of the first and second trenches 101 and 102. In the second region R2, the deep trenches 103 may be formed between the second NMOSFET and PMOSFET regions NR2 and PR2 to define the second NMOSFET and PMOSFET regions NR2 and PR2.

In the first region R1, the first active patterns AP1 may be formed in such a way that they are spaced apart from each other at a pitch of the first length L1, and the second active patterns AP2 may be formed in such a way that they are spaced apart from each other at a pitch of a second length L2. An adjacent pair of the first and second active patterns AP1 and AP2 may be formed in such a way that they are spaced apart from each other by a pitch of a third length L3. Here, the second length L2 may be longer than the first length L1, and the third length L3 may be longer than the second length L2.

By contrast, in the second region R2, the second active patterns AP2 may be formed in such a way that they are spaced apart from each other at a pitch of a fourth length L4, and the first active patterns AP1 may be formed in such a way that they are spaced apart from each other at a pitch of a fifth length L5. Here, the fourth length L4 may be substantially equal to the fifth length L5.

In each of the regions R1 and R2, first device isolation patterns ST1 may be formed in the deep trenches 103, respectively. In addition, second device isolation patterns ST2 may be formed in the first and second trenches 101 and 102. The second device isolation patterns ST2 may be formed to expose upper portions of the first and second active patterns AP1 and AP2. The upper portions of the first and second active patterns AP1 and AP2 exposed by the second device isolation patterns ST2 will be referred to as first and second active fins AF1 and AF2, respectively. In some example embodiments, the first and second device isolation patterns ST1 and ST2 may be substantially connected to each other to form a single insulating pattern. The first and second device isolation patterns ST1 and ST2 may be formed of or include a silicon oxide layer.

Referring to FIGS. 5 and 6A to 6D, sacrificial gate patterns 110 may be formed on each of the regions R1 and R2 of the substrate 100, and gate mask patterns 115 may be formed on the sacrificial gate patterns 110. The sacrificial gate patterns 110 may be formed to cross the first and second active patterns AP1 and AP2 and extend in the first direction D1. Each of the sacrificial gate patterns 110 may be formed to cover top and side surfaces of the first and second active fins AF1 and AF2, and moreover, the sacrificial gate patterns 110 may extend to cover top surfaces of the first and second device isolation patterns ST1 and ST2.

The formation of the sacrificial gate patterns 110 and the gate mask patterns 115 may include sequentially forming a sacrificial gate layer and a gate mask layer on the substrate 100 to cover the first and second active fins AF1 and AF2 and patterning the gate mask layer and the sacrificial gate layer. The sacrificial gate layer may be formed of or include a poly silicon layer. The gate mask layer may be formed of or include a silicon nitride layer or a silicon oxynitride layer.

Because the sacrificial gate patterns 110 are formed to cross the first and second active fins AF1 and AF2, each of the second device isolation patterns ST2 may have a first portion P1 and second portions P2. For example, the first portion P1 may be a portion of the second device isolation pattern ST2 that is positioned below the sacrificial gate pattern 110 and is overlapped with the sacrificial gate pattern 110 in a plan view. The second portions P2 may be other portions of the second device isolation pattern ST2 that are positioned at opposite sides of the sacrificial gate pattern 110 and are horizontally separated from each other by the first portion P1.

Thereafter, a gate spacer layer 120 may be formed on the substrate 100 to conformally cover the sacrificial gate patterns 110. As an example, the gate spacer layer 120 may be formed of or include at least one of a silicon oxide layer, a silicon nitride layer, or a silicon oxynitride layer. The gate spacer layer 120 may be formed by a deposition process (e.g., a CVD or ALD process). In example embodiments, the gate spacer layer 120 may be formed to cover the first and second active fins AF1 and AF2 exposed by the sacrificial gate patterns 110.

Referring to FIGS. 7A to 7D, the gate spacer layer 120 may be anisotropically etched to form gate spacers GS, and here, the gate spacers GS may be formed to cover opposite side surfaces of each of the sacrificial gate patterns 110. Moreover, the gate spacer layer 120 on the first and second active fins AF1 and AF2 also may be anisotropically etched to form other gate spacers GS, and not drawn here, the other gate spacers GS may be formed to cover opposite side surfaces, which may be exposed by the sacrificial gate patterns 110, of each of the first and second active fins AF1 and AF2.

An etching process may be performed to remove upper portions of the first and second active patterns AP1 and AP2, which provided on each of the regions R1 and R2 and are positioned at opposite sides of each of the sacrificial gate patterns 110. The other gate spacers GS on the first and second active fins AF1 and AF2 also may be removed during the etching process. The etching process may include forming a mask pattern on the substrate 100 and etching the upper portions of the first and second active patterns AP1 and AP2 using the mask pattern as an etch mask. The etching process may be performed in a dry and/or wet etching manner.

In some example embodiments, the etching process may be performed in such a way that the second active patterns AP2 are over-etched to have top surfaces lower than those of the first active patterns AP1.

As a result, each of the first active patterns AP1 may have a first top surface TSa1, which is etched during the etching process, and a second top surface TSa2, which is positioned below the sacrificial gate patterns 110 and is not etched during the etching process. That is, the second top surface TSa2 may be higher than the first top surface TSa1. Each of the second active patterns AP2 may have a first top surface TSb1, which is etched during the etching process, and a second top surface TSb2, which is positioned below the sacrificial gate patterns 110 and is not etched during the etching process. That is, the second top surface TSb2 may be higher than the first top surface TSb1. In some example embodiments, the first top surfaces TSa1 and TSb1 of the first and second active patterns AP1 and AP2 may have a downward rounded profile.

Because, compared with the first active patterns AP1, the second active patterns AP2 are more deeply etched, the first top surface TSb1 of each of the second active patterns AP2 may be lower than the first top surface TSa1 of each of the first active patterns AP1. Furthermore, a width W2 of the first top surface TSb1 of the second active pattern AP2 may be greater than a width W1 of the first top surface TSa1 of the first active pattern AP1. However, the second top surface TSa2 of each of the first active patterns AP1 may be positioned at substantially the same level as the second top surface TSb2 of each of the second active patterns AP2.

When the upper portions of the first and second active patterns AP1 and AP2 are removed from the first region R1, upper portions of the second portions P2 of the second device isolation pattern ST2 may be recessed. As a result, recess regions RS1, RS2, and RS3 may be formed on the second portions P2 of the second device isolation pattern ST2.

For example, first recess regions RS1 may be formed between the first active patterns AP1, second recess regions RS2 may be formed between the second active patterns AP2, and third recess regions RS3 may be formed between adjacent pairs of the first and second active patterns AP1 and AP2. The first to third recess regions RS1-RS3 may be formed to have a recess depth that is dependent on a pattern density (i.e., a space between the first and second active patterns AP1 and AP2).

Upper portions of the second portions P2 of the second device isolation pattern ST2 on the second region R2 may also be recessed. As a result, recess regions RS4 and RS5 may be formed on the second portions P2, respectively, of the second device isolation pattern ST2.

For example, fourth recess regions RS4 may be formed between the second active patterns AP2, and fifth recess regions RS5 may be formed between the first active patterns AP1. The fourth and fifth recess regions RS4 and RS5 may be formed to have substantially the same recess depth.

Thereafter, first and second source/drain regions SD1 and SD2 may be formed at opposite sides of each of the sacrificial gate patterns 110. The first source/drain regions SD1 may be formed on the first top surfaces TSa1 of the first active patterns AP1, respectively, and the second source/drain regions SD2 may be formed on the first top surfaces TSb1 of the second active patterns AP2, respectively. In other words, the first source/drain regions SD1 may be formed by a selective epitaxial growth process using the first top surfaces TSa1 of the first active patterns AP1 as a seed layer. The second source/drain regions SD2 may be formed by a selective epitaxial growth process using the first top surfaces TSb1 of the second active patterns AP2 as a seed layer.

The first source/drain regions SD1 may be formed to exert a tensile strain to first channel regions CH1 of the first active fins AF1 interposed therebetween. For example, in the case where the substrate 100 is a silicon substrate, the first source/drain regions SD1 may be formed of a Si or SiC layer. The first source/drain regions SD1 may be doped with n-type impurities after or during the epitaxial growth process.

By contrast, the second source/drain regions SD2 may be formed to exert a compressive strain to the second channel regions CH2 of the second active fins AF2 interposed therebetween. For example, in the case where the substrate 100 is a silicon substrate, the second source/drain regions SD2 may be formed of a SiGe layer. The second source/drain regions SD2 may be doped with p-type impurities after or during the epitaxial growth process.

Because the first and second source/drain regions SD1 and SD2 are formed of different materials that are grown through the epitaxial growth process, the first and second source/drain regions SD1 and SD2 may be different from each other in terms of their shape or size. For example, the maximum width W3 of the first source/drain regions SD1 may be different from the maximum width W4 in the second direction D2 of the second source/drain regions SD2. In addition, the second source/drain regions SD2 may be grown to have high thickness uniformity, compared with the first source/drain regions SD1. For example, when viewed in a section taken in the first direction D1, the second source/drain regions SD2 may have sharp top portions. By contrast, the first source/drain regions SD1 may have flat or truncated top portions.

The second source/drain regions SD2 on the first region R1 may be formed to be spaced apart from each other in the first direction D1. By contrast, the second source/drain regions SD2 on the second region R2 may be merged to each other during the epitaxial growth process. Accordingly, the second source/drain regions SD2 on the second region R2 may constitute a single source/drain region extending in the first direction D1. Because the second source/drain regions SD2 on the second region R2 are merged to each other, first air gaps AG1 may be formed below the second source/drain regions SD2 on the second region R2. The first air gaps AG1 may be regions that are directly enclosed by the second source/drain regions SD2 and the second device isolation patterns ST2.

Referring to FIGS. 8 and 9A to 9D, an etch stop layer 125 may be conformally formed on each of the regions R1 and R2. The etch stop layer 125 may be formed to cover the first and second device isolation patterns ST1 and ST2, the first and second source/drain regions SD1 and SD2, and the gate spacers GS. In addition, the etch stop layer 125 may be formed to cover inner surfaces of the first, second, third, and fifth recess regions RS1-RS3 and RS5 of the second device isolation patterns ST2. The etch stop layer 125 may be formed of a material having an etch selectivity with respect to a first interlayered insulating layer 130 to be described below. As an example, the etch stop layer 125 may be formed of or include a silicon nitride layer or a silicon oxynitride layer. The etch stop layer 125 may be formed using a CVD or ALD process.

A first interlayered insulating layer 130 may be formed on the substrate 100 provided with the etch stop layer 125. As an example, the first interlayered insulating layer 130 may be formed of or include a silicon oxide layer. Thereafter, a planarization process may be performed on the first interlayered insulating layer 130 to expose top surfaces of the sacrificial gate patterns 110. The planarization process may include an etch-back process and/or a chemical mechanical polishing (CMP) process. In example embodiments, the planarization process may be performed to remove not only a portion of the etch stop layer 125 but also the gate mask patterns 115, which are provided on the sacrificial gate patterns 110.

The sacrificial gate patterns 110 may be removed to form gap regions 140, and here, the gap regions 140 may be formed to expose the first and second channel regions CH1 and CH2 of the first and second active fins AF1 and AF2 between the gate spacers GS. In some example embodiments, the gap regions 140 may be formed by an etching process of selectively removing the sacrificial gate patterns 110.

An oxidation process using plasma may be performed on the first and second channel regions CH1 and CH2, and as a result, interface layers IL may be grown from the first and second channel regions CH1 and CH2, respectively. In other words, the interface layer IL may be formed by thermally or chemically oxidizing the exposed surfaces of the first and second channel regions CH1 and CH2. Plasma generated from at least one of oxygen ($O_2$), ozone ($O_3$), or steam ($H_2O$) may be used in the oxidation process. The interface layers IL may be formed of or include a silicon oxide layer.

A gate insulating pattern GI and a gate electrode GE may be sequentially formed to fill each of the gap regions 140. In detail, a gate insulating layer may be formed to partially fill the gap regions 140. The gate dielectric layer may be formed to cover the top surfaces of the first and second active fins AF1 and AF2. As an example, the gate dielectric layer may be formed of at least one of a silicon oxide layer, a silicon oxynitride layer, or high-k dielectric layers, whose dielectric constants are higher than that of the silicon oxide layer. A gate conductive layer may be formed on the gate dielectric layer to fill the remaining portions of the gap regions 140. As an example, the gate conductive layer may be formed of or include at least one of doped semiconductor, conductive metal nitrides, or metals. The gate dielectric layer and the gate conductive layer may be planarized, and as a result, the gate insulating pattern GI and the gate electrode GE may be formed in each of the gap regions 140.

The gate insulating patterns GI and gate electrodes GE in the gap regions 140 may be partially recessed, and capping patterns GP may be formed on the gate electrodes GE, respectively. As an example, the capping patterns GP may be formed of or include at least one of a silicon oxide layer, a silicon nitride layer, or a silicon oxynitride layer.

Referring back to FIGS. 1 and 2A to 2D, a second interlayered insulating layer 150 may be formed on the first interlayered insulating layer 130. As an example, the second interlayered insulating layer 150 may be formed using a silicon oxide layer.

Source/drain contacts CA may be formed at opposite sides of each of the gate electrodes GE. For example, contact holes may be formed to penetrate the second interlayered insulating layer 150, the first interlayered insulating layer 130, and the etch stop layer 125 and to expose the first and second source/drain regions SD1 and SD2. In example embodiments, upper portions of the first and second source/drain regions SD1 and SD2 may be partially etched, when the contact holes are formed. Thereafter, a first conductive pattern 160 and a second conductive pattern 165 may be sequentially formed to fill each of the contact holes. The first conductive pattern 160 may be a barrier conductive layer and may be formed of or include at least one of a titanium nitride layer, a tungsten nitride layer, or a tantalum nitride layer. The second conductive pattern 165 may be a metal layer and may be formed of or include at least one of tungsten, titanium, or tantalum.

Although not shown, interconnection lines may be formed on the second interlayered insulating layer 150 and may be coupled to the source/drain contacts CA, respectively. The interconnection lines may be formed of or include at least one of conductive materials.

Figure 10:
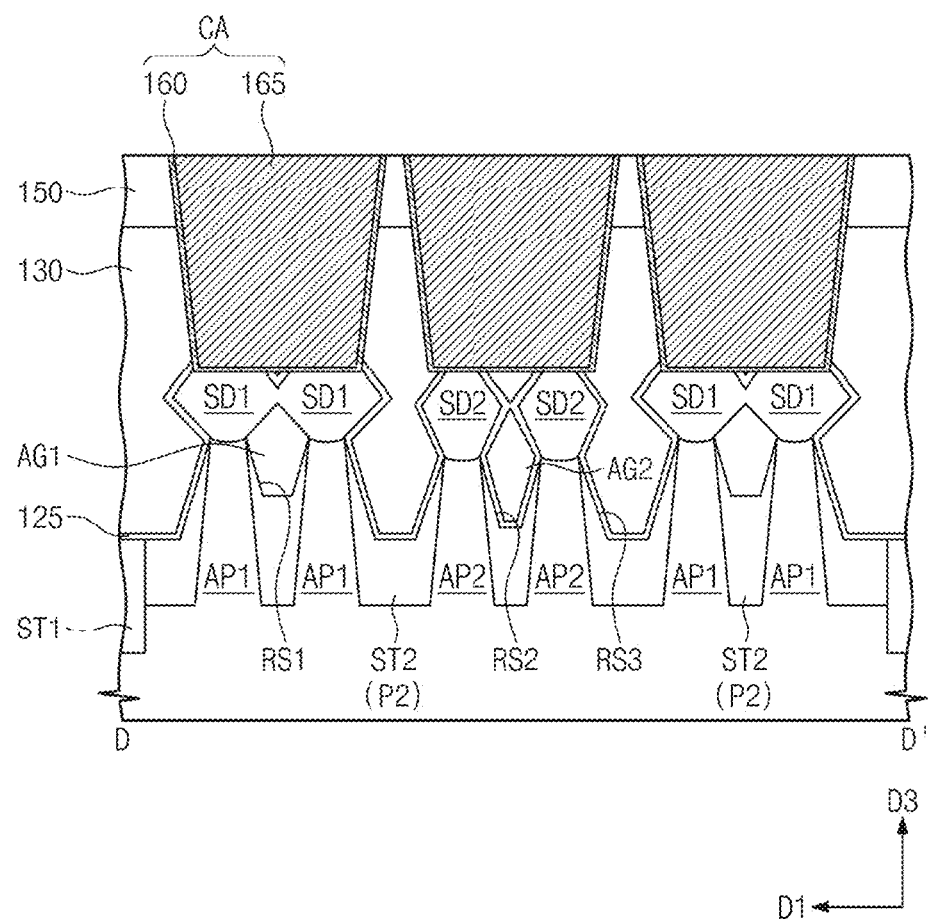
FIG. 10 is a sectional view that is taken along line D-D' of FIG. 1 to illustrate a semiconductor device according to some example embodiments of the inventive concepts.

FIG. 10 is a sectional view that is taken along line D-D' of FIG. 1 to illustrate a semiconductor device according to some example embodiments of the inventive concepts. In the following description, an element previously described with reference to FIGS. 1 and 2A to 2D may be identified by a similar or identical reference number without repeating an overlapping description thereof, for the sake of brevity.

Referring to FIGS. 1 and 10, the first source/drain regions SD1 on the first region R1 may be merged to form a single source/drain region extending in the first direction D1. Unlike that shown in FIG. 2C, the first source/drain regions SD1 may be merged to each other, but they may be grown in a relatively irregular manner.

The first air gaps AG1 may be formed below the first source/drain regions SD1 and in the first recess regions RS1, respectively. The first air gaps AG1 may be directly enclosed by the first source/drain regions SD1 and the second device isolation patterns ST2. In other words, the first air gaps AG1 may not be enclosed by the etch stop layer 125. Because the first air gaps AG1 are provided below the first source/drain regions SD1, reducing parasitic capacitance between the first active patterns AP1 may be possible.

On the first region R1, the etch stop layer 125 may be formed to fill gap regions between the second source/drain regions SD2 adjacent to each other. For example, the etch stop layer 125 may be conformally formed on the second source/drain regions SD2 in such a way that the gap regions between the second source/drain regions SD2 are sealed by the etch stop layer 125. Accordingly, second air gaps AG2 may be formed in the second recess regions RS2, respectively.

Unlike the first air gaps AG1, the second air gaps AG2 may be covered with the etch stop layer 125. Because the second recess regions RS2 are formed to have bottom surfaces lower than those of the first recess regions RS1, the second air gaps AG2 may be larger than the first air gaps AG1. Because the second air gaps AG2 are provided below the second source/drain regions SD2, reducing parasitic capacitance between the second active patterns AP2 may be possible.

Figure 11:
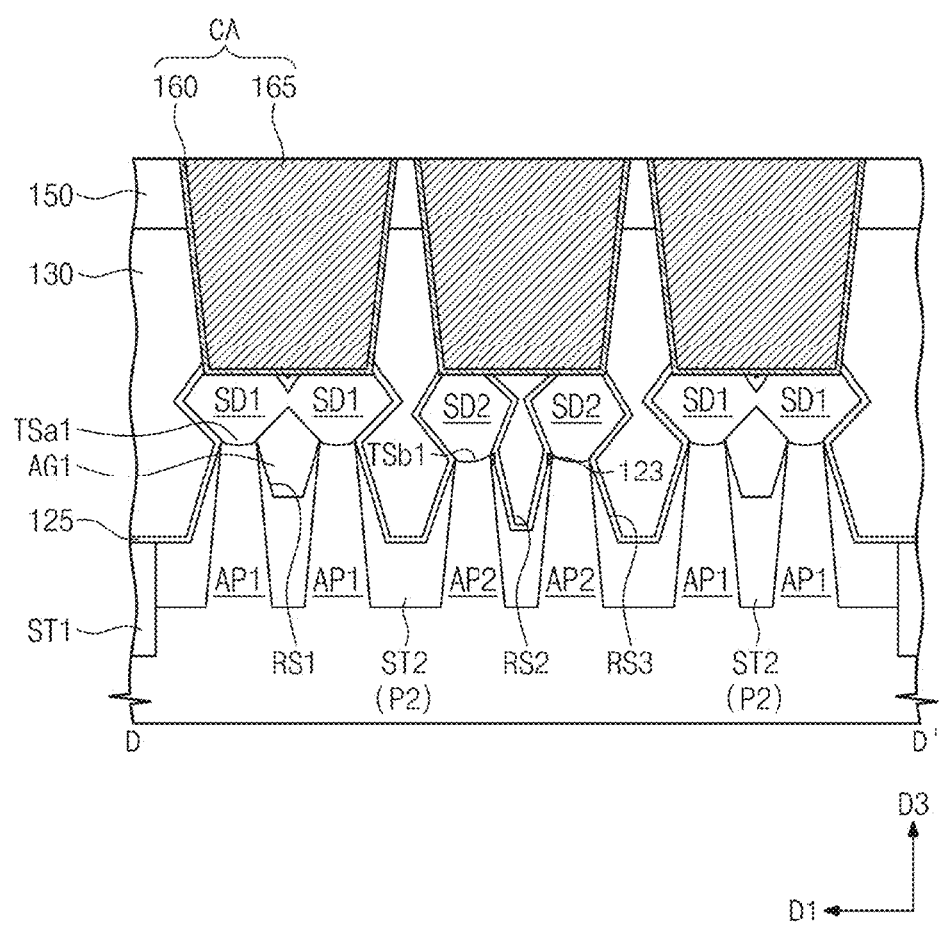
FIG. 11 is a sectional view that is taken along line D-D' of FIG. 1 to illustrate a semiconductor device according to some example embodiments of the inventive concepts.

FIG. 11 is a sectional view that is taken along line D-D' of FIG. 1 to illustrate a semiconductor device according to some example embodiments of the inventive concepts. In the following description, an element previously described with reference to FIGS. 1 and 2A to 2D may be identified by a similar or identical reference number without repeating an overlapping description thereof, for the sake of brevity.

Referring to FIGS. 1 and 11, the first source/drain regions SD1 on the first region R1 may be merged to form a single source/drain region extending in the first direction D1. The first air gaps AG1 may be formed below the first source/drain regions SD1 and in the first recess regions RS1, respectively.

First residue patterns 123 may be provided adjacent to interfaces between the second source/drain regions SD2 and the second active patterns AP2. The first residue patterns 123 may be formed between an adjacent pair of the second active patterns AP2. By contrast, the first residue patterns 123 may not be formed between an adjacent pair of the first active pattern AP1 and the second active pattern AP2.

As previously described with reference to FIGS. 6C and 7C, the gate spacer layer 120 covering the first and second active patterns AP1 and AP2 may be removed when the upper portions of the first and second active patterns AP1 and AP2 are recessed. However, in example embodiments, a portion of the gate spacer layer 120 may not be removed from the gap regions between the second active patterns AP2, thereby forming the first residue pattern 123. Owing to the presence of the first residue patterns 123, upper portions of the second active patterns AP2 may be incompletely recessed, and thus, the first top surfaces TSb1 of the second active patterns AP2 may be an inclined or asymmetric profile, unlike the first top surfaces TSa1 of the first active patterns AP1.

Owing to the presence of the first residue patterns 123 and/or the inclined or asymmetric profile of the first top surfaces TSb1, the second source/drain regions SD2 may be at an angle to the top surface of the substrate 100. For example, the second source/drain region SD2 may bend toward the first source/drain region SD1 adjacent thereto.

Figure 12:
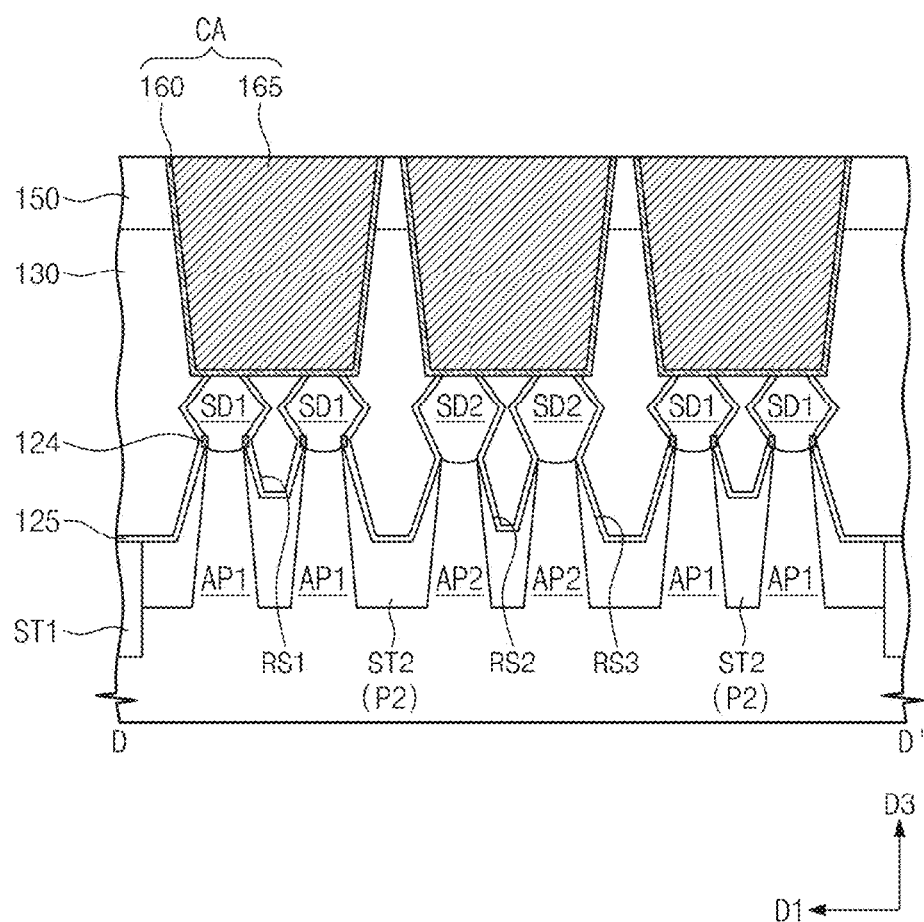
FIG. 12 is a sectional view that is taken along line D-D' of FIG. 1 to illustrate a semiconductor device according to some example embodiments of the inventive concepts.

FIG. 12 is a sectional view that is taken along line D-D' of FIG. 1 to illustrate a semiconductor device according to some example embodiments of the inventive concepts. In the following description, an element previously described with reference to FIGS. 1 and 2A to 2D may be identified by a similar or identical reference number without repeating an overlapping description thereof, for the sake of brevity.

Referring to FIGS. 1 and 12, second residue patterns 124 may be formed to be adjacent to interfaces between the first source/drain regions SD1 and the first active patterns AP1 and on the first region R1. For example, the second residue patterns 124 may be formed on opposite side surfaces of a lower portion of at least one of the first source/drain regions SD1. When measured in the first direction D1, the at least one of the first source/drain regions SD1 may have an increasing width from the second residue patterns 124.

As previously described with reference to FIGS. 6C and 7C, the gate spacer layer 120 covering the first and second active patterns AP1 and AP2 may be removed when the upper portions of the first and second active patterns AP1 and AP2 are recessed. However, in example embodiments, a portion of the gate spacer layer 120 may not be removed from opposite sides of each of the first active patterns AP1, thereby forming the second residue patterns 124.

According to some example embodiments of the inventive concepts, a semiconductor device may be configured to include NMOS and PMOS-FETs having source/drain structures different from each other. This configuration may allow improvement to electric characteristics of NMOS and PMOSFETs independently.

While example embodiments of the inventive concepts have been particularly shown and described, it will be understood by one of ordinary skill in the art that variations in form and detail may be made therein without departing from the spirit and scope of the attached claims.

What is claimed is:

1. A semiconductor device, comprising:
a substrate including an NMOSFET region and a PMOSFET region;
a plurality of first active fins on the NMOSFET region;
a plurality of second active fins on the PMOSFET region;
a first device isolation layer between the NMOSFET region and the PMOSFET region;
a second device isolation layer between a pair of the first active fins;
a third device isolation layer between a pair of the second active fins;
a gate electrode on the first and second active fins, the gate electrode extending in a first direction;
a first source/drain pattern on the first active fins; and
a second source/drain pattern on the second active fins,
wherein the first and second source/drain patterns are adjacent to a side of the gate electrode,
a lowermost point of the first source/drain pattern is at a first level,
a lowermost point of the second source/drain pattern is at a second level,
the first level is higher than the second level,
a thickness of the first device isolation layer is greater than a thickness of the second device isolation layer, and
wherein the thickness of the first device isolation layer is greater than a thickness of the third device isolation layer.

2. The semiconductor device of claim 1, wherein a pitch between the first active fins is substantially the same as a pitch between the second active fins.

3. The semiconductor device of claim 1, wherein the lowermost point of the first source/drain pattern contacts an uppermost sidewall of one of the first active fins,
wherein the lowermost point of the second source/drain pattern contacts an uppermost sidewall of one of the second active fins,
wherein the one of the first active fins has a first width in the first direction at the first level,
wherein the one of the second active fins has a second width in the first direction at the second level, and
wherein the second width is greater than the first width.

4. The semiconductor device of claim 1, wherein the thickness of the second device isolation layer is substantially the same with the thickness of the third device isolation layer.

5. The semiconductor device of claim 1, wherein a width of the first device isolation layer is greater than a width of the second device isolation layer, and
wherein the width of the first device isolation layer is greater than a width of the third device isolation layer.

6. The semiconductor device of claim 1, further comprising an air gap under the second source/drain pattern and between a pair of the second active fins.

7. The semiconductor device of claim 1, further comprising an etch stop layer covering an outer surface of the first source/drain pattern and an outer surface of the second source/drain pattern.

8. The semiconductor device of claim 1, wherein the first source/drain pattern is a first epitaxial pattern formed by a first selective epitaxial growth process using top surfaces of the first active fins as a first seed layer, and
wherein the second source/drain pattern is a second epitaxial pattern formed by a second selective epitaxial growth process using top surfaces of the second active fins as a second seed layer.

9. The semiconductor device of claim 1, wherein the first source/drain pattern has a different shape from the second source/drain pattern.

10. The semiconductor device of claim 1, wherein top surfaces of the second active fins have a rounded profile.

11. A semiconductor device, comprising:
a substrate including a first region and a second region;
a first active fin on the first region of the substrate;
a second active fin on the first region of the substrate;
a third active fin on the second region of the substrate, the second active fin being between the first active fin and the third active fin;
a fourth active fin on the second region of the substrate, the third active fin being between the second active fin and the fourth active fin;

a gate electrode on the first, second, third and fourth active fins;
a first source/drain pattern on each of the first and second active fins; and
a second source/drain pattern on each of the third and fourth active fins,
wherein the first source/drain pattern has a different conductivity from that of the second source/drain pattern,
a lowermost bottom of a first recess between the first and second active fins is higher than a lowermost bottom of a second recess between the third and fourth active fins, and
a lowermost bottom of a third recess between the second and third active fins is lower than the lowermost bottom of the second recess.

12. The semiconductor device of claim 11, wherein the first source/drain pattern has a lowermost point contacting an uppermost sidewall of each of the first and second active fins,
wherein the second source/drain pattern has a lowermost point contacting an uppermost sidewall of each of the third and fourth active fins, and
wherein the lowermost point of the first source/drain pattern is higher than the lowermost point of the second source/drain pattern.

13. The semiconductor device of claim 11, wherein a distance between a top portion of the first active fin and a top portion of the second active fin is different from a distance between the top portion of the second active fin and a top portion of the third active fin.

14. The semiconductor device of claim 11, wherein the first region includes an NMOSFET region, and the second region includes a PMOSFET region.

15. A semiconductor device, comprising:
first and second active patterns protruding upward from a substrate;
a gate electrode crossing the first and second active patterns, the gate electrode extending in a first direction;
a device isolation layer on the substrate and covering lower sidewalls of the first and second active patterns;
a first source/drain region on the first active pattern and on at least one side of the gate electrode, a lowermost point of the first source/drain region contacting an uppermost sidewall of the first active pattern;
a second source/drain region on the second active pattern and on at least one side of the gate electrode, the second source/drain region having a conductivity type different from that of the first source/drain region, a lowermost point of the second source/drain region contacting an uppermost sidewall of the second active pattern;
an etch stop layer covering the first and second source/drain regions and the device isolation layer; and
a first air gap between the first source/drain region and the device isolation layer,
wherein the lowermost point of the first source/drain region is positioned at a first level,
wherein the lowermost point of the second source/drain region is positioned at a second level,
wherein the first level is higher than the second level,
wherein the first active pattern has a first width in the first direction at the first level,
wherein the second active pattern has a second width in the first direction at the second level,
wherein the second width is greater than the first width, and
wherein the first air gap is separated from the etch stop layer.

16. The device of claim 15, further comprising a second air gap between the second source/drain region and the device isolation layer,
wherein the second air gap is deeper than the first air gap.

17. The device of claim 16, wherein
the first active pattern and the first source/drain region constitute an NMOSFET; and
the second active pattern and the second source/drain region constitute a PMOSFET.

18. The device of claim 17, wherein a maximum width of the first source/drain region in the first direction is a third width and a maximum width of the second source/drain region in the first direction is a fourth width different from the third width.

* * * * *